(12) United States Patent
Segar et al.

(10) Patent No.: US 9,416,911 B2
(45) Date of Patent: Aug. 16, 2016

(54) BRAKE STAND SYSTEMS

(71) Applicant: Ergotron, Inc., St. Paul, MN (US)

(72) Inventors: Peter Segar, Burnsville, MN (US);
Jeffrey R. Mensing, Plymouth, MN (US); Shaun C. Lindblad, Lino Lakes, MN (US); Saeb Asamarai, Columbia Heights, MN (US); Mustafa A. Ergun, Shoreview, MN (US)

(73) Assignee: Ergotron, Inc., St. Paul, MN (US)

( * ) Notice: Subject to any disclaimer, the term of this patent is extended or adjusted under 35 U.S.C. 154(b) by 261 days.

(21) Appl. No.: 14/134,577

(22) Filed: Dec. 19, 2013

(65) Prior Publication Data

US 2014/0104806 A1 Apr. 17, 2014

Related U.S. Application Data

(62) Division of application No. 12/961,920, filed on Dec. 7, 2010, now Pat. No. 8,659,884.

(60) Provisional application No. 61/267,250, filed on Dec. 7, 2009.

(51) Int. Cl.
| | |
|---|---|
| *F16M 11/04* | (2006.01) |
| *F16M 11/08* | (2006.01) |
| *F16M 11/10* | (2006.01) |
| *F16M 11/20* | (2006.01) |

(Continued)

(52) U.S. Cl.
CPC ............. *F16M 11/046* (2013.01); *F16M 11/08* (2013.01); *F16M 11/10* (2013.01); *F16M 11/2014* (2013.01); *F16M 11/24* (2013.01); *H05K 7/02* (2013.01); *F16M 2200/027* (2013.01); *F16M 2200/028* (2013.01); *F16M 2200/041* (2013.01); *Y10T 29/49716* (2015.01)

(58) Field of Classification Search
CPC ............................ F16M 11/18; F16M 11/046
USPC .................. 361/679.21–679.25; 248/917–920
See application file for complete search history.

(56) References Cited

U.S. PATENT DOCUMENTS

| | | | | |
|---|---|---|---|---|
| 2,409,075 A | * | 10/1946 | Starck | ..................... F21V 21/22 248/571 |
| 4,669,694 A | | 6/1987 | Malick | |
| 5,022,137 A | | 6/1991 | Sorensen et al. | |

(Continued)

FOREIGN PATENT DOCUMENTS

| | | |
|---|---|---|
| CN | 1734680 A | 2/2006 |
| CN | 1925730 A | 3/2007 |

(Continued)

OTHER PUBLICATIONS

"U.S. Appl. No. 12/961,920, Non Final Office Action mailed Mar. 26, 2013", 14 pgs.

(Continued)

*Primary Examiner* — Adrian S Wilson
(74) *Attorney, Agent, or Firm* — Schwegman Lundberg & Woessner, P.A.

(57) ABSTRACT

A stand for an electronic display. The stand includes a brake mechanism to selectively fix the position of the display at a desired vertical position. An actuator proximate an outer edge of the display to selectively lock and unlock the brake mechanism. A brake mechanism locked and unlocked by tilting a display.

24 Claims, 29 Drawing Sheets

(51) Int. Cl.
*F16M 11/24* (2006.01)
*H05K 7/02* (2006.01)

(56) References Cited

U.S. PATENT DOCUMENTS

| | | | |
|---|---|---|---|
| 5,918,841 A | 7/1999 | Sweere et al. | |
| 6,233,139 B1* | 5/2001 | Hamon | F16M 11/10 248/918 |
| 6,381,125 B1* | 4/2002 | Mizoguchi | F16M 11/24 312/223.1 |
| 6,427,288 B1* | 8/2002 | Saito | F16M 11/105 16/335 |
| 6,712,321 B1 | 3/2004 | Su et al. | |
| 7,068,497 B2 | 6/2006 | Chu | |
| 7,086,631 B2 | 8/2006 | Lee et al. | |
| 7,233,488 B2 | 6/2007 | Liou et al. | |
| 7,410,143 B2 | 8/2008 | Chen | |
| 7,430,113 B2 | 9/2008 | Mcright et al. | |
| 7,490,796 B2* | 2/2009 | Kim | F16M 11/10 248/123.11 |
| 7,564,682 B2* | 7/2009 | Liou | F16M 11/105 248/125.1 |
| 7,644,897 B2 | 1/2010 | Shin | |
| 7,646,593 B2 | 1/2010 | Smejkalova | |
| 7,677,509 B2 | 3/2010 | Jang | |
| 7,694,919 B2 | 4/2010 | Lee | |
| 8,052,102 B2 | 11/2011 | Hu et al. | |
| 8,228,668 B2 | 7/2012 | Asamarai et al. | |
| 8,286,927 B2 | 10/2012 | Sweere et al. | |
| 8,659,884 B2 | 2/2014 | Segar et al. | |
| 2002/0088910 A1* | 7/2002 | Sweere | F16M 11/10 248/286.1 |
| 2004/0011932 A1 | 1/2004 | Duff | |
| 2004/0035989 A1 | 2/2004 | Sweere et al. | |
| 2005/0236533 A1 | 10/2005 | Mcright et al. | |
| 2006/0145046 A1 | 7/2006 | Liou et al. | |
| 2006/0175476 A1 | 8/2006 | Hasegawa et al. | |
| 2006/0176655 A1* | 8/2006 | Hillman | F16M 11/04 361/679.06 |
| 2006/0219849 A1 | 10/2006 | Chiu et al. | |
| 2007/0001076 A1 | 1/2007 | Asamarai et al. | |
| 2007/0040084 A1 | 2/2007 | Sturman et al. | |
| 2007/0045488 A1* | 3/2007 | Shin | F16M 11/04 248/176.1 |
| 2007/0064379 A1 | 3/2007 | Shin et al. | |
| 2007/0102596 A1* | 5/2007 | Sung | F16M 11/04 248/122.1 |
| 2007/0194182 A1 | 8/2007 | Lee | |
| 2007/0205345 A1* | 9/2007 | Chen | F16M 11/04 248/297.31 |
| 2008/0026892 A1 | 1/2008 | Asamarai et al. | |
| 2008/0303845 A1 | 12/2008 | Mcright et al. | |
| 2009/0001239 A1 | 1/2009 | Dong et al. | |
| 2009/0179133 A1 | 7/2009 | Gan et al. | |
| 2009/0314912 A1 | 12/2009 | Whitley et al. | |
| 2012/0019990 A1 | 1/2012 | Segar | |
| 2012/0069508 A1 | 3/2012 | Sweere et al. | |

FOREIGN PATENT DOCUMENTS

| | | |
|---|---|---|
| CN | 101026017 A | 8/2007 |
| CN | 101371069 A | 2/2009 |
| TW | I281573 B | 5/2007 |
| WO | WO-2007/137905 A1 | 12/2007 |
| WO | WO-2011/071856 A2 | 6/2011 |

OTHER PUBLICATIONS

"U.S. Appl. No. 12/961,920, Notice of Allowance mailed Sep. 23, 2013", 10 pgs.
"U.S. Appl. No. 12/961,920, Response filed Jan. 10, 2013 to Restriction Requirement mailed Dec. 24, 2012", 2 pgs.
"U.S. Appl. No. 12/961,920, Response filed Jul. 26, 2013 to Non Final Office Action mailed Mar. 26, 2013", 5 pgs.
U.S. Appl. No. 12/961,920, Restriction Requirement mailed Dec. 14, 2012, 7 pgs.
"Chinese Application Serial No. 201080062828.X, Office Action mailed Dec. 25, 2013", (w/ English Translation), 21 pgs.
"International Application Serial No. PCT/US2010/059200, International Preliminary Report on Patentability dated Jun. 12, 2012", 8 pgs.
"International Application Serial No. PCT/US2010/059200, International Search Report mailed Jun. 6, 2011", 2 pgs.
"International Application Serial No. PCT/US2010/059200, Written Opinion mailed Jun. 6, 2011", 7 pgs.

* cited by examiner

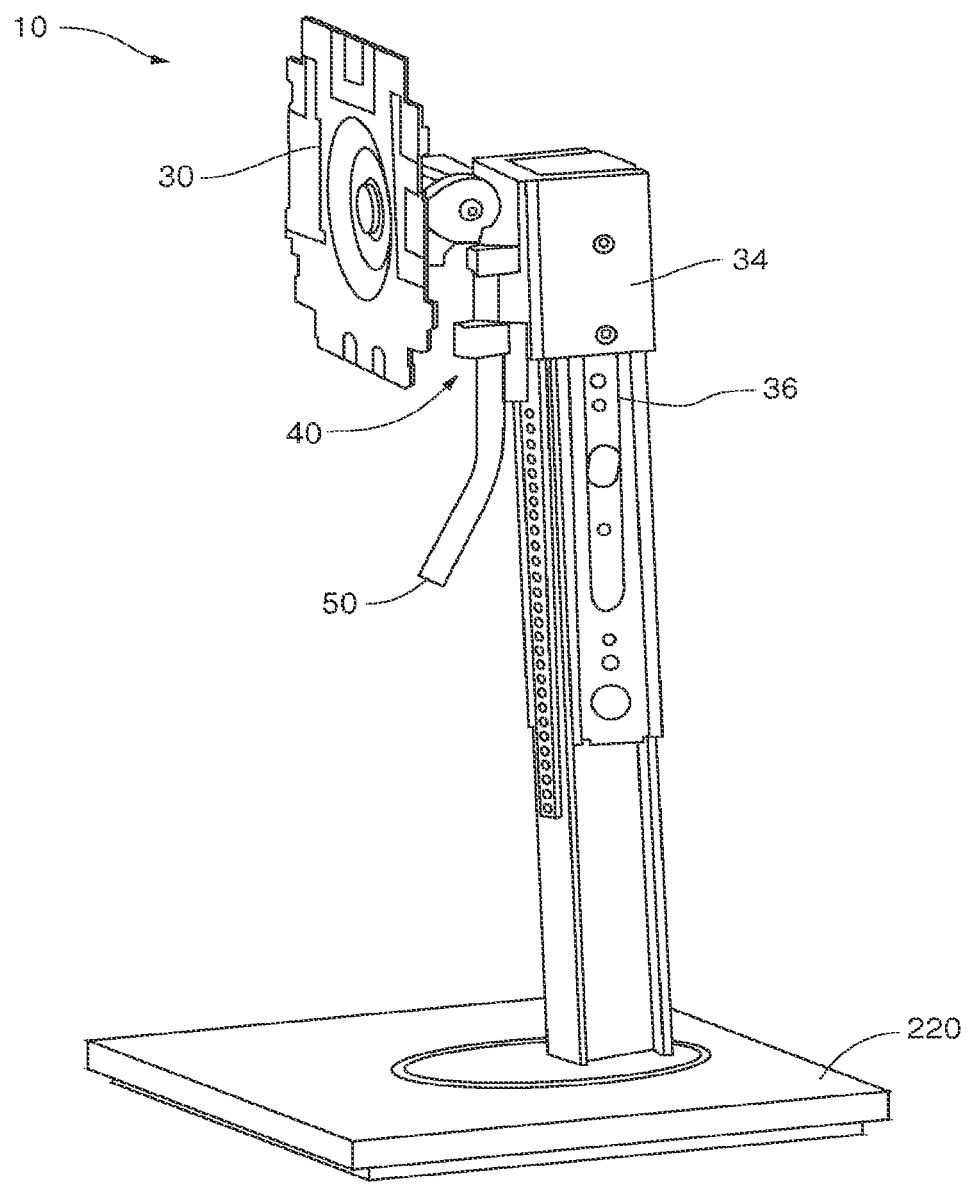

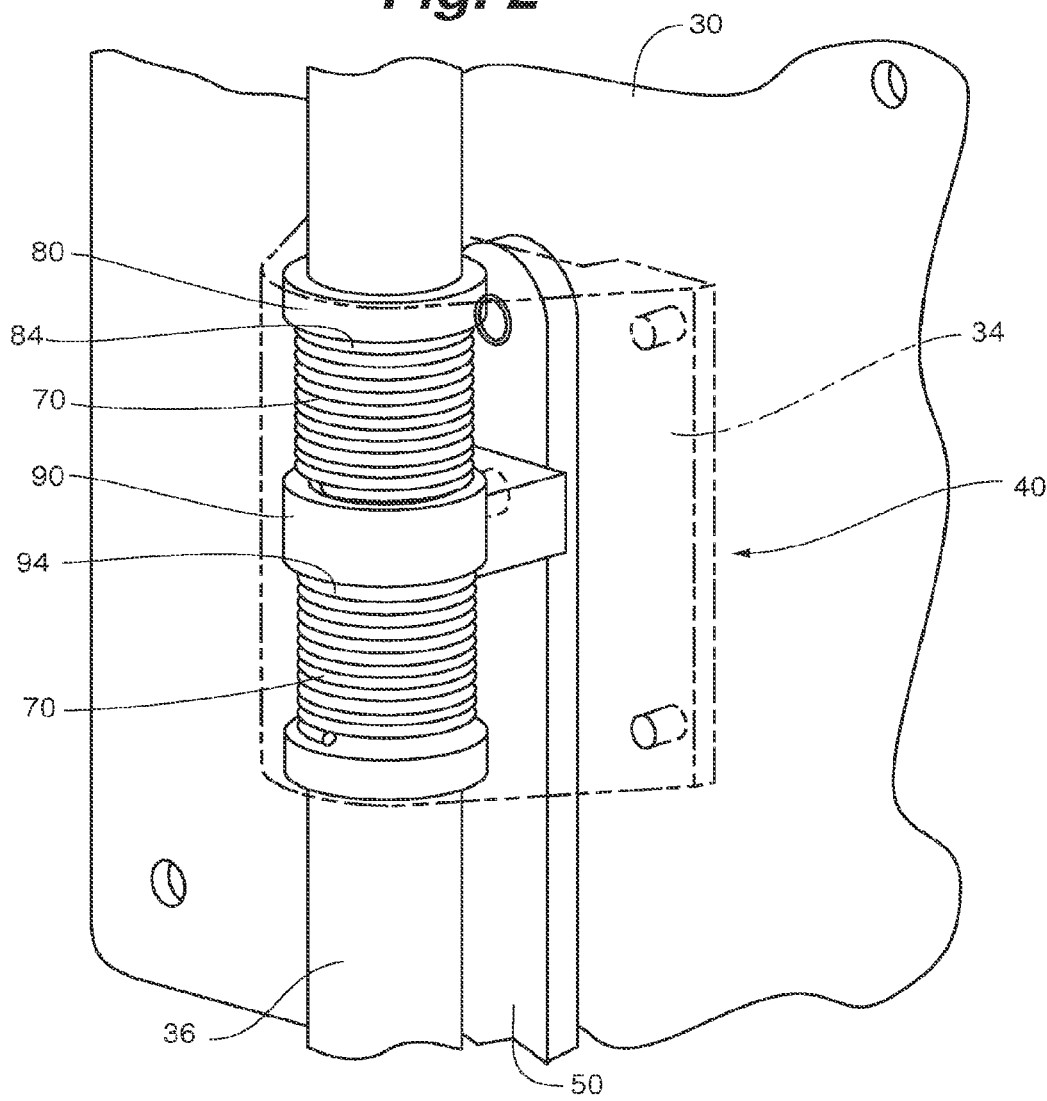

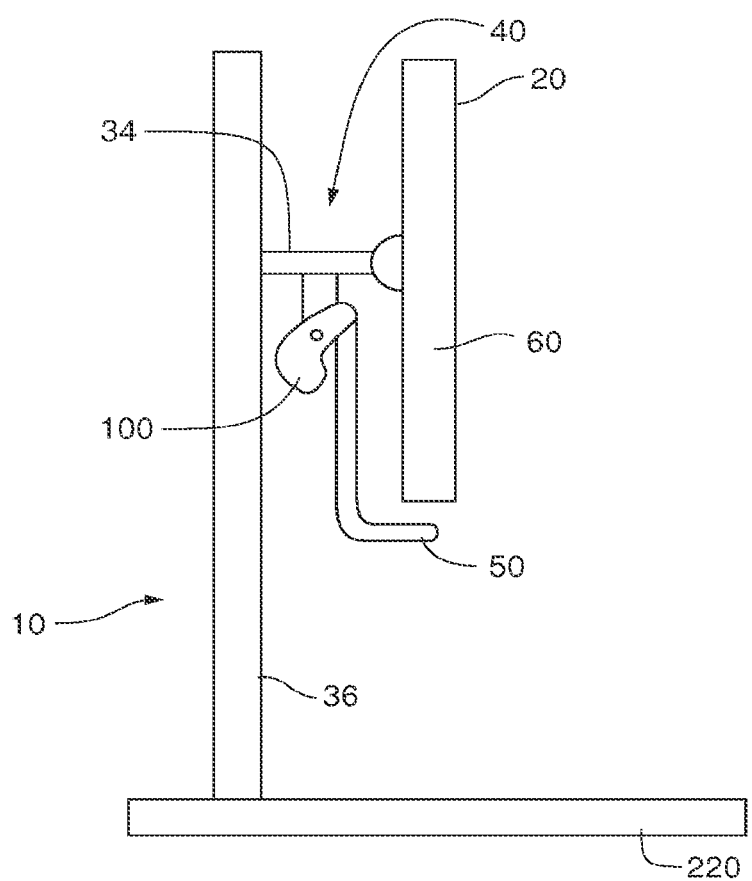

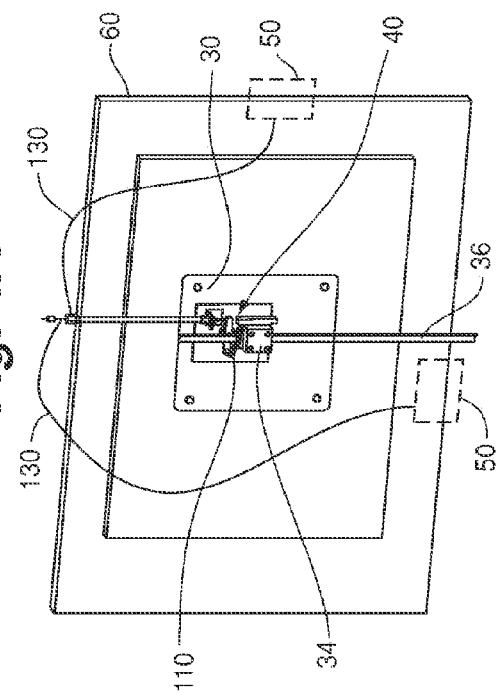
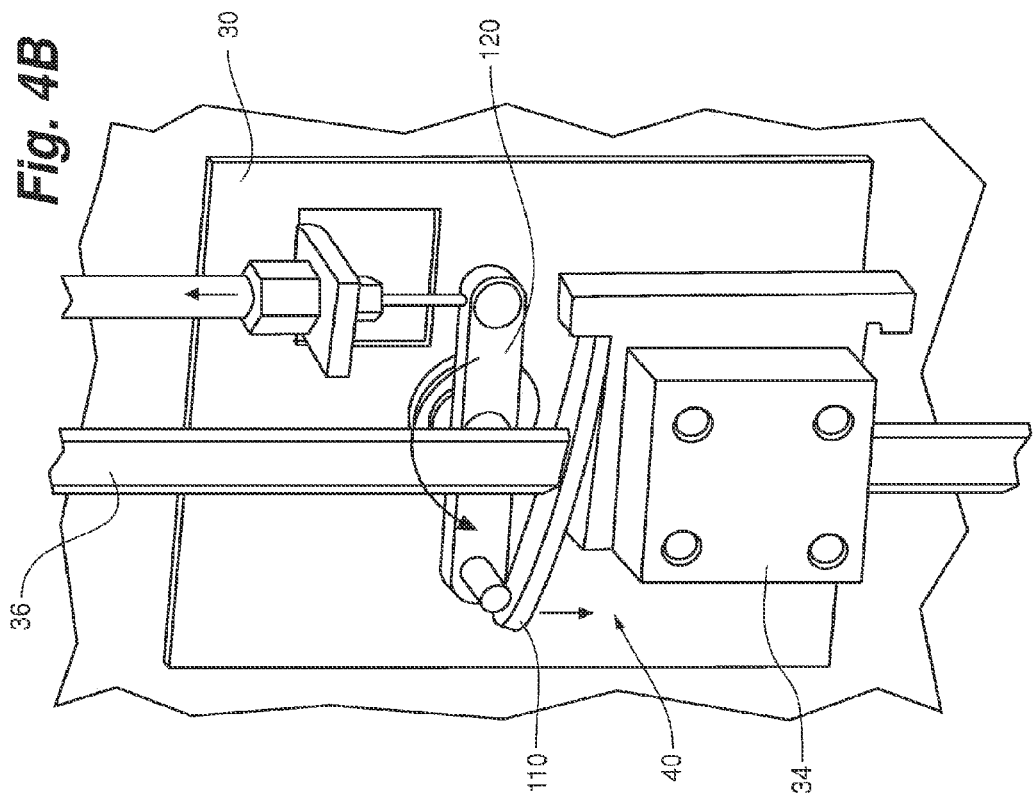

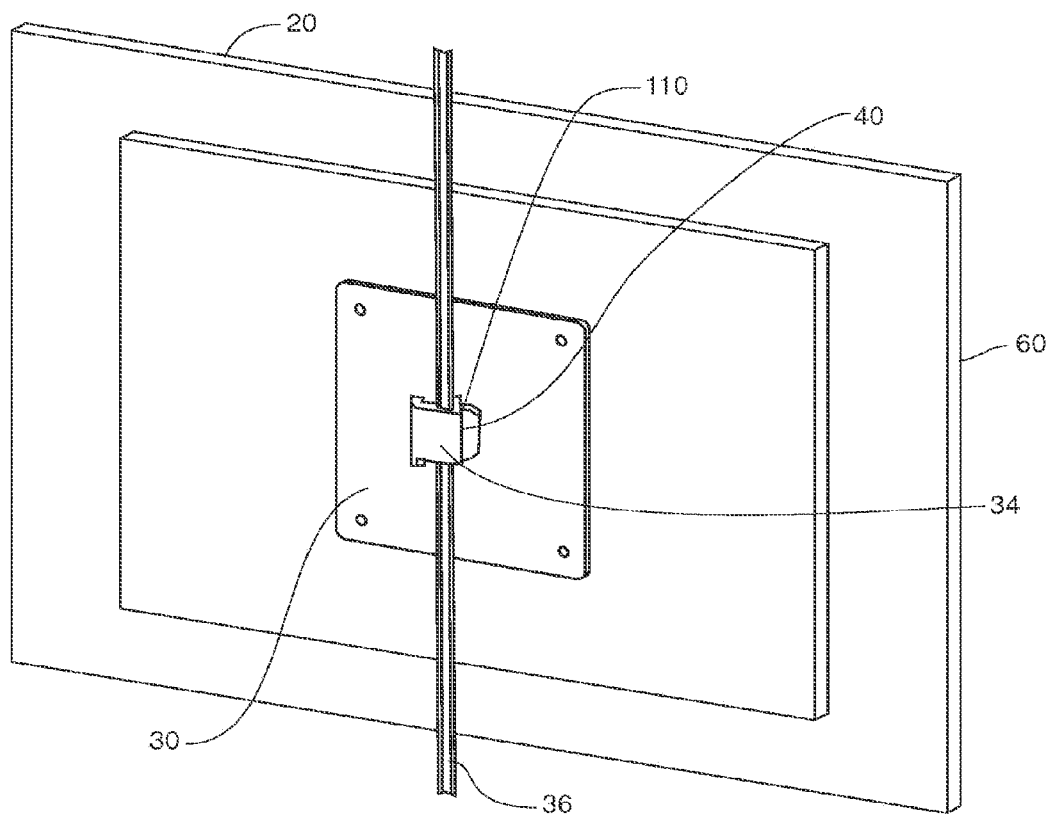

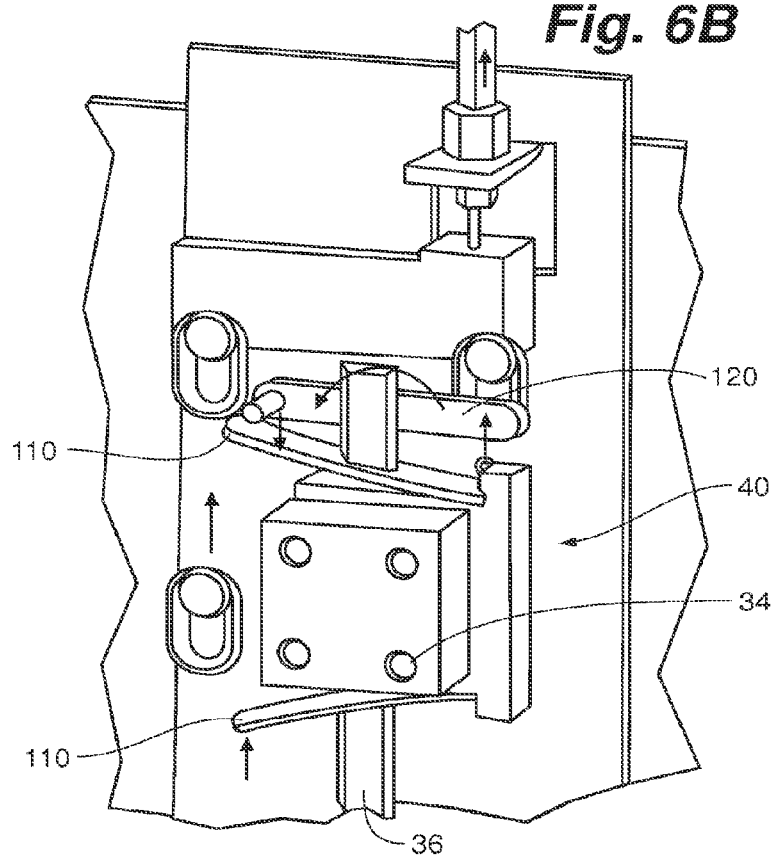
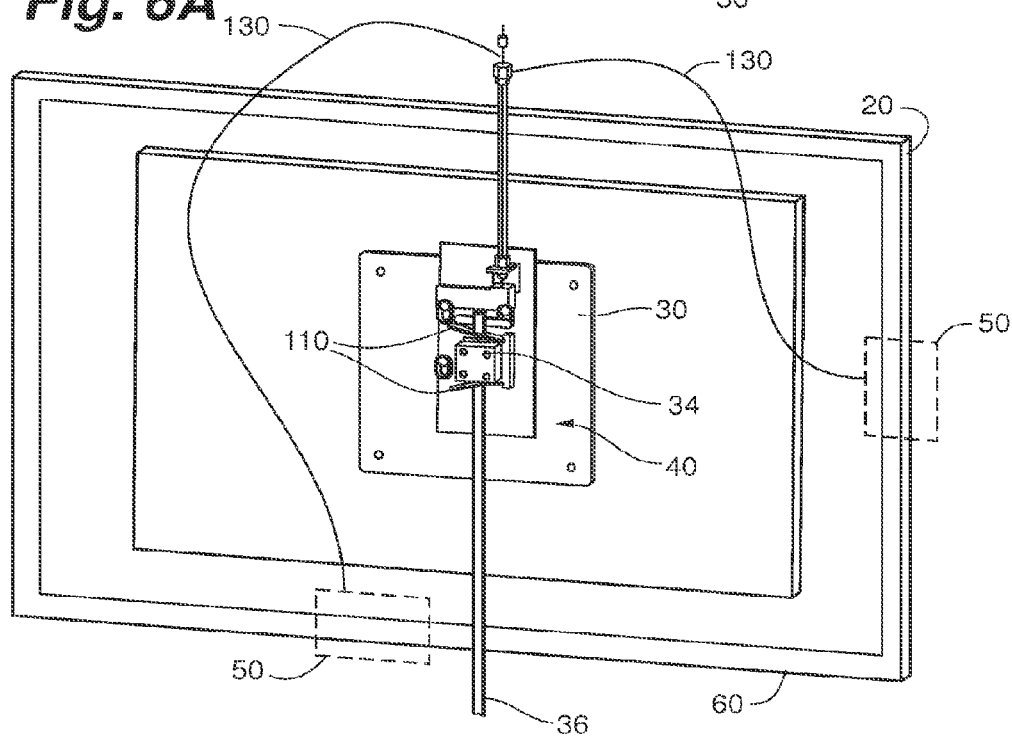

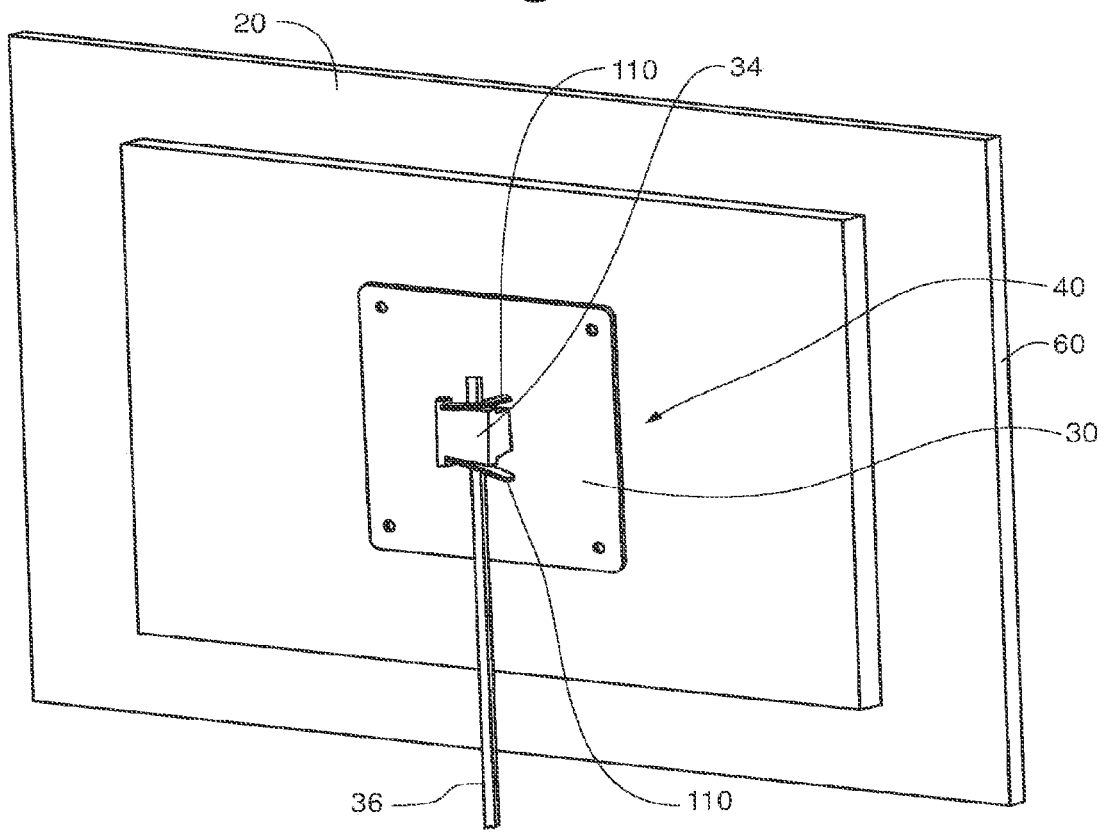

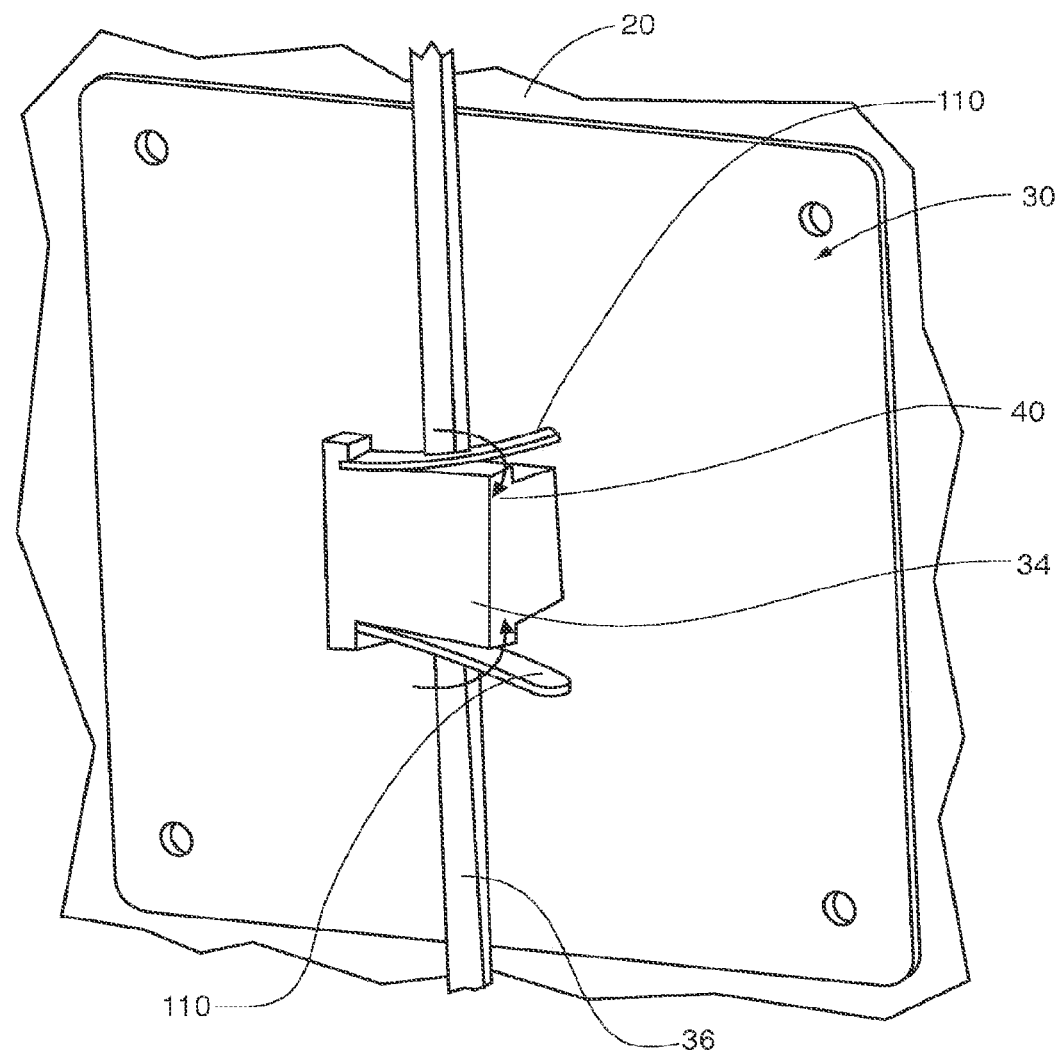

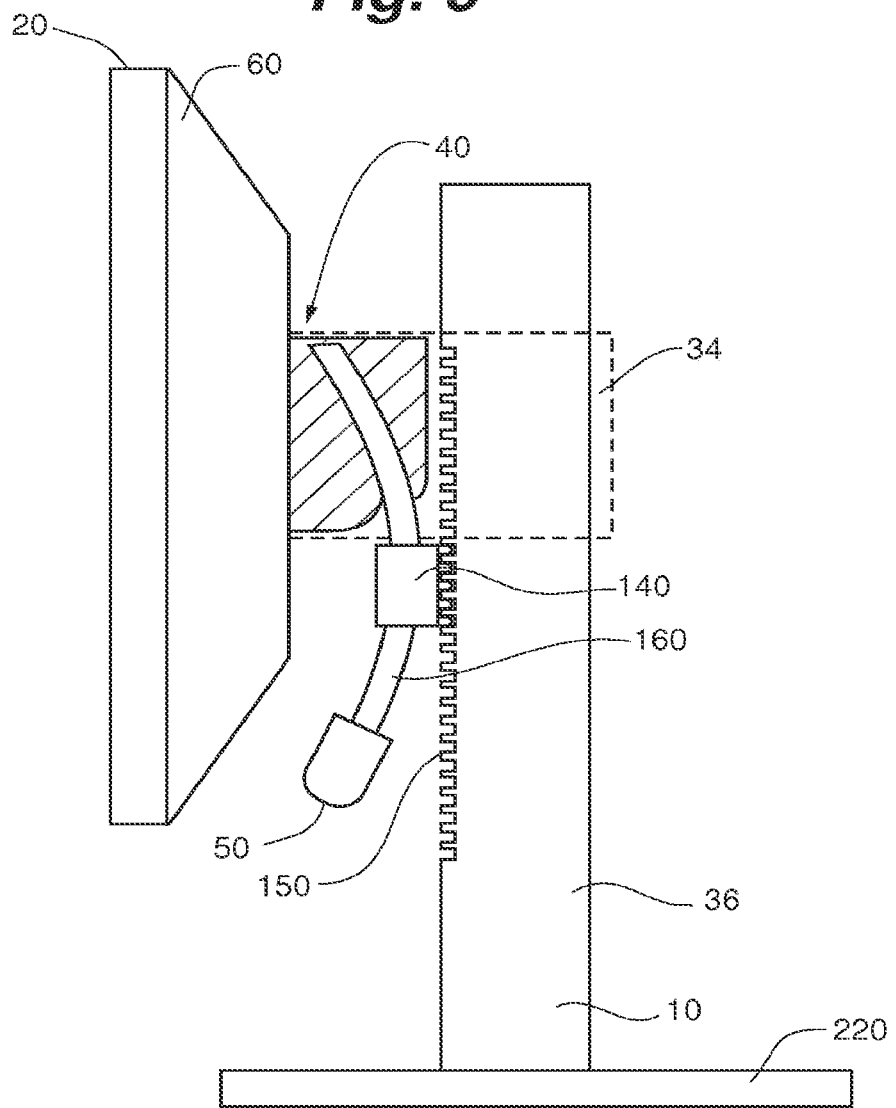

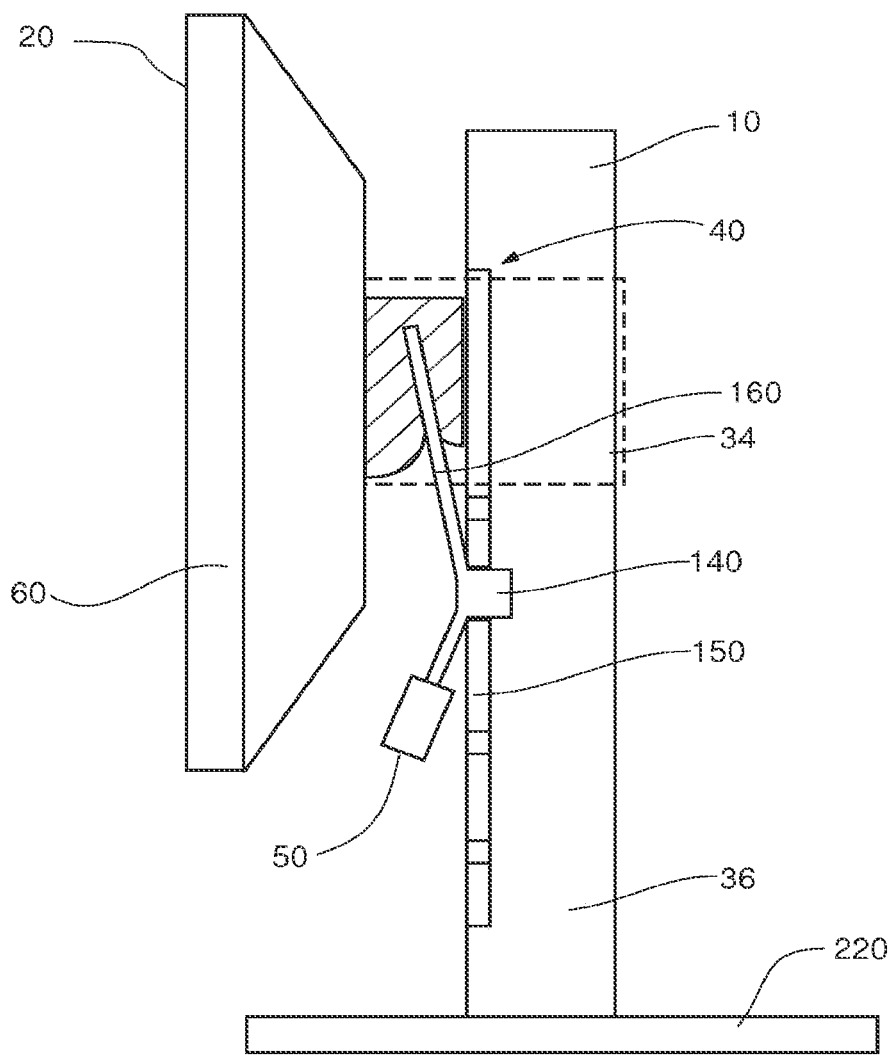

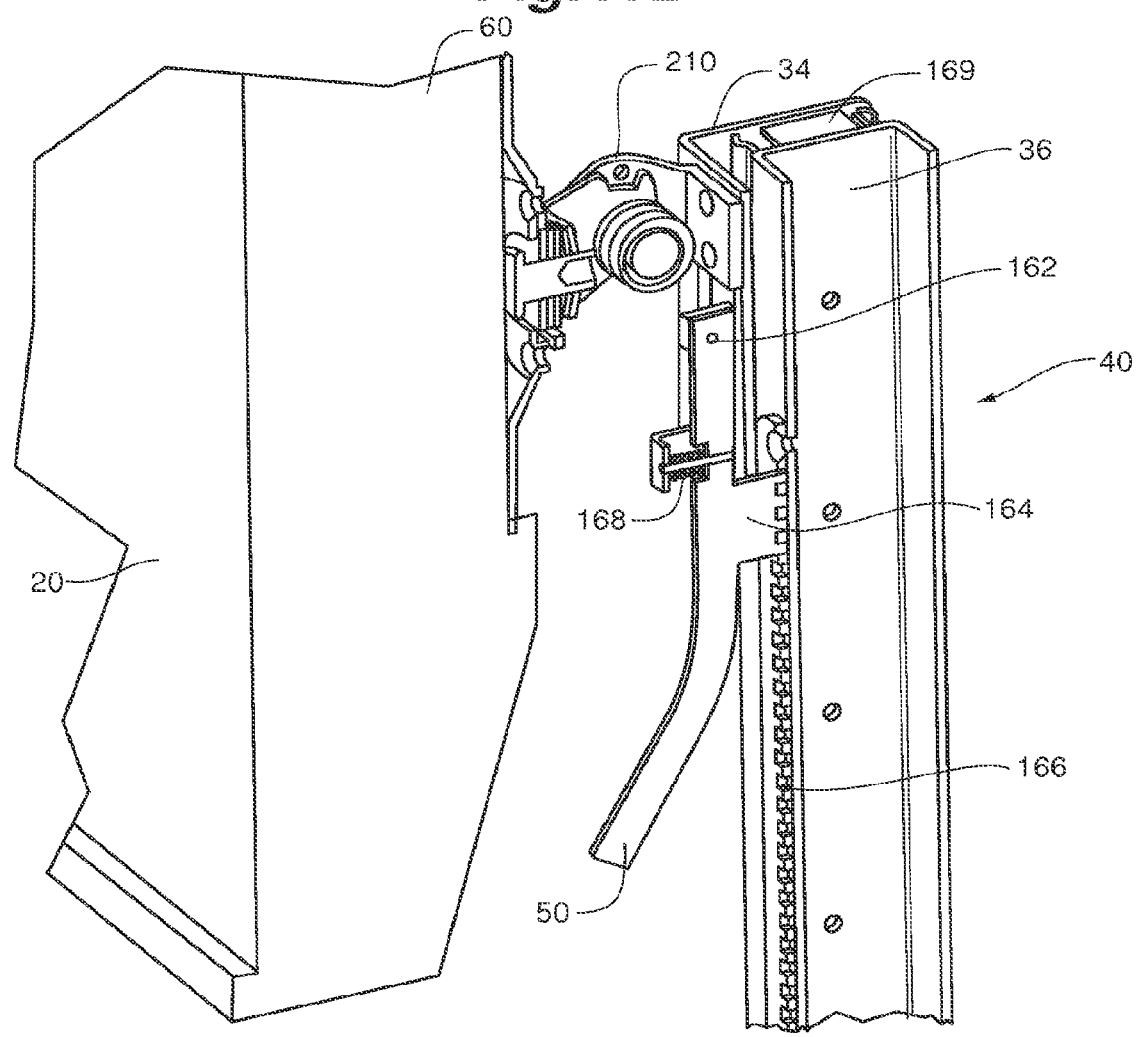

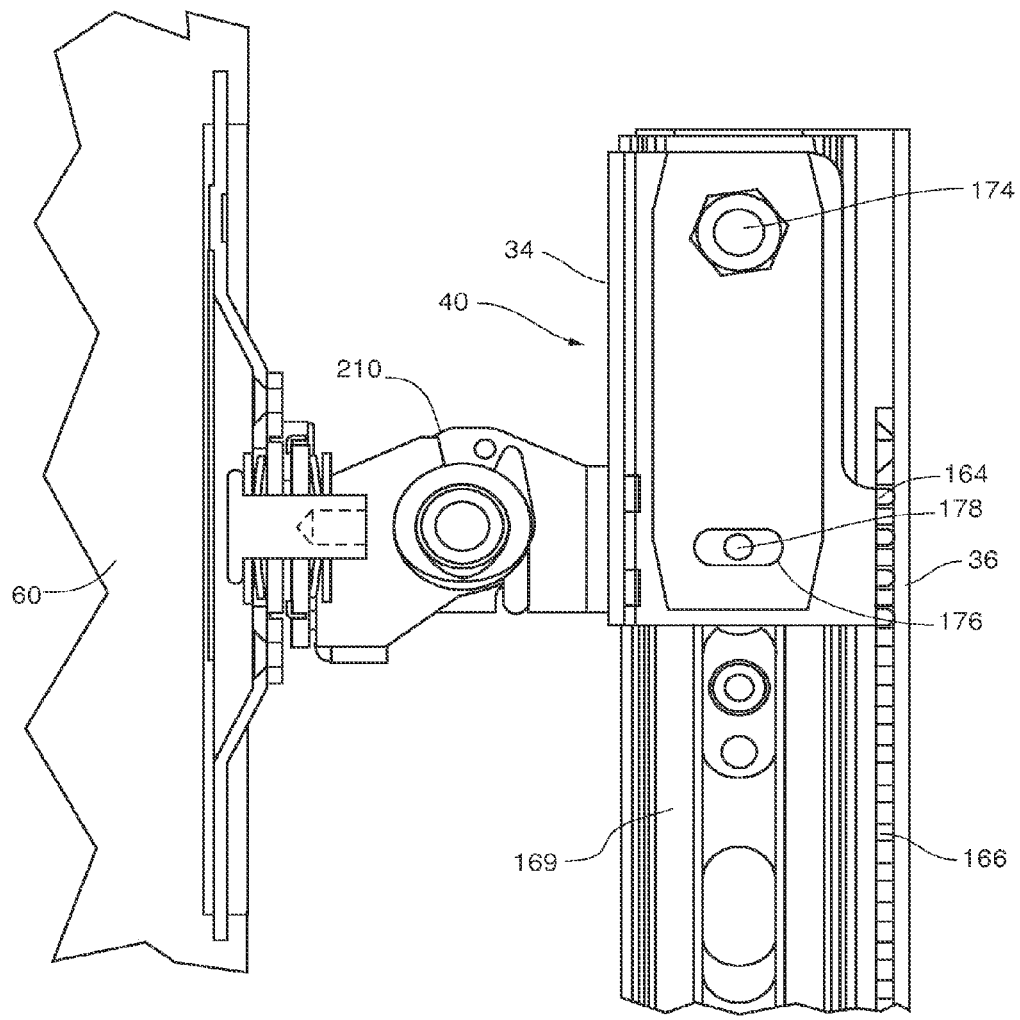

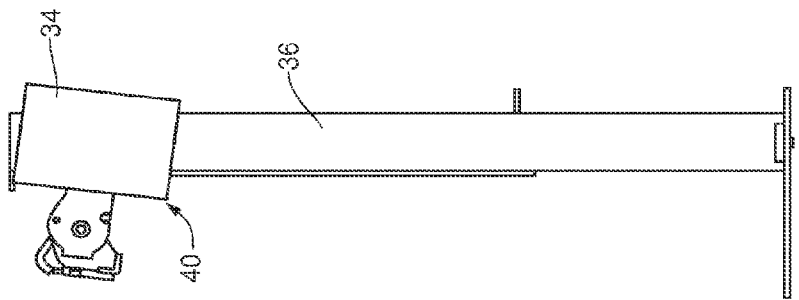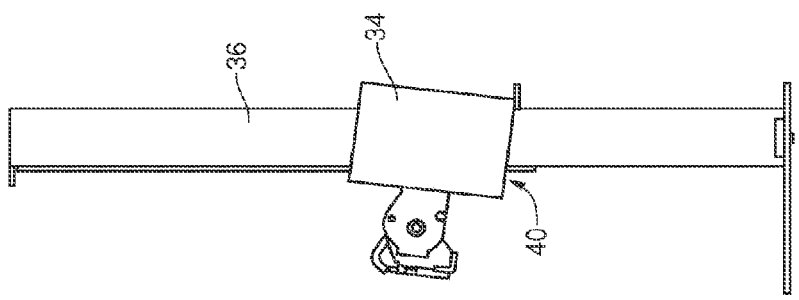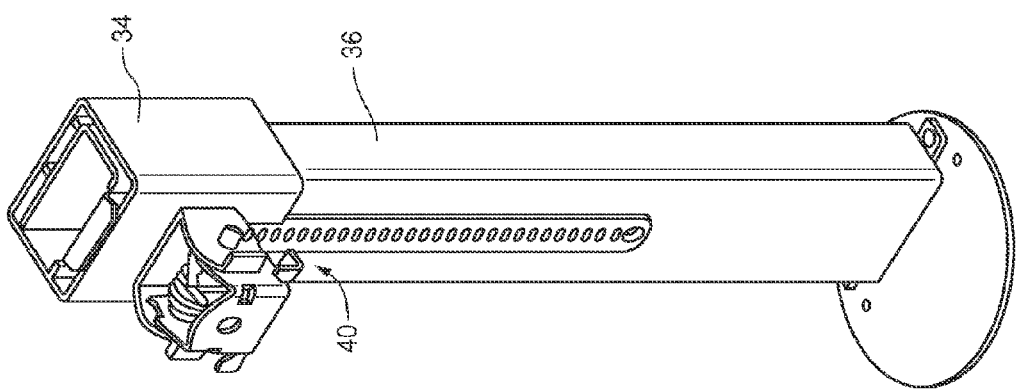

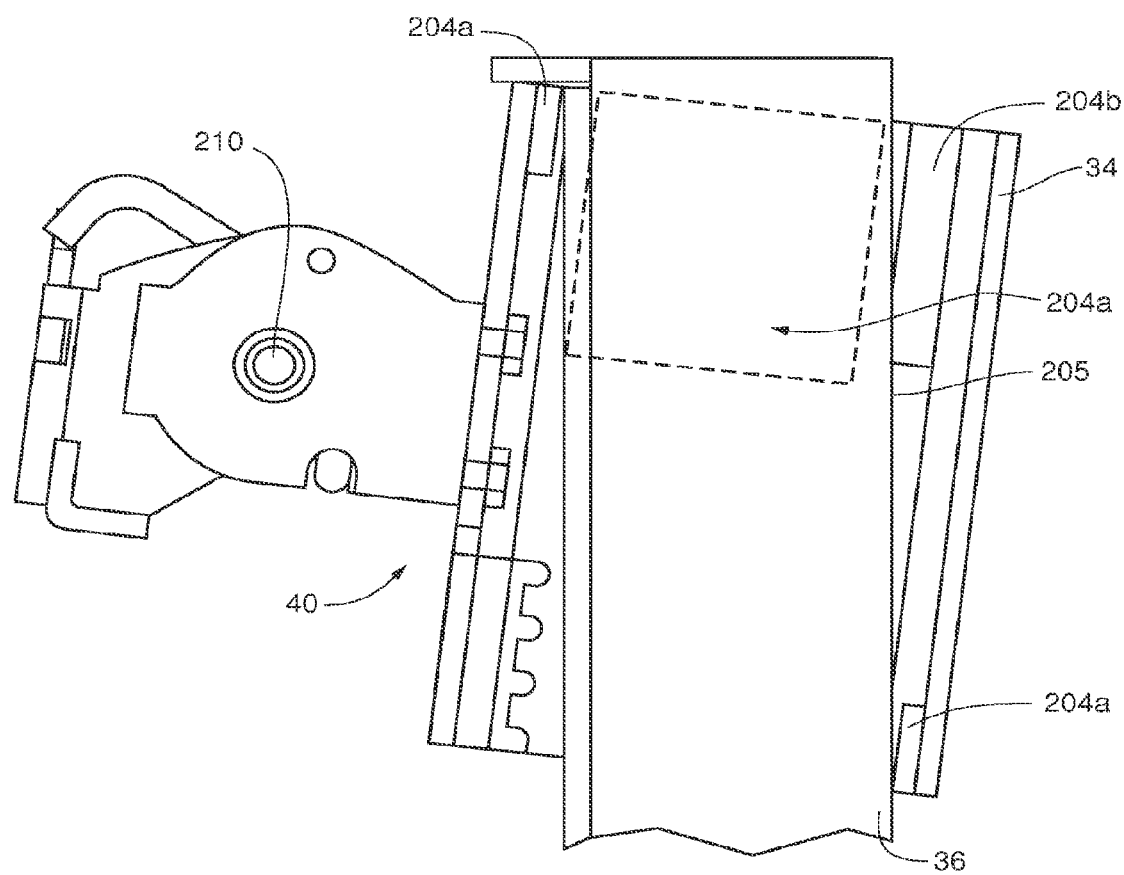

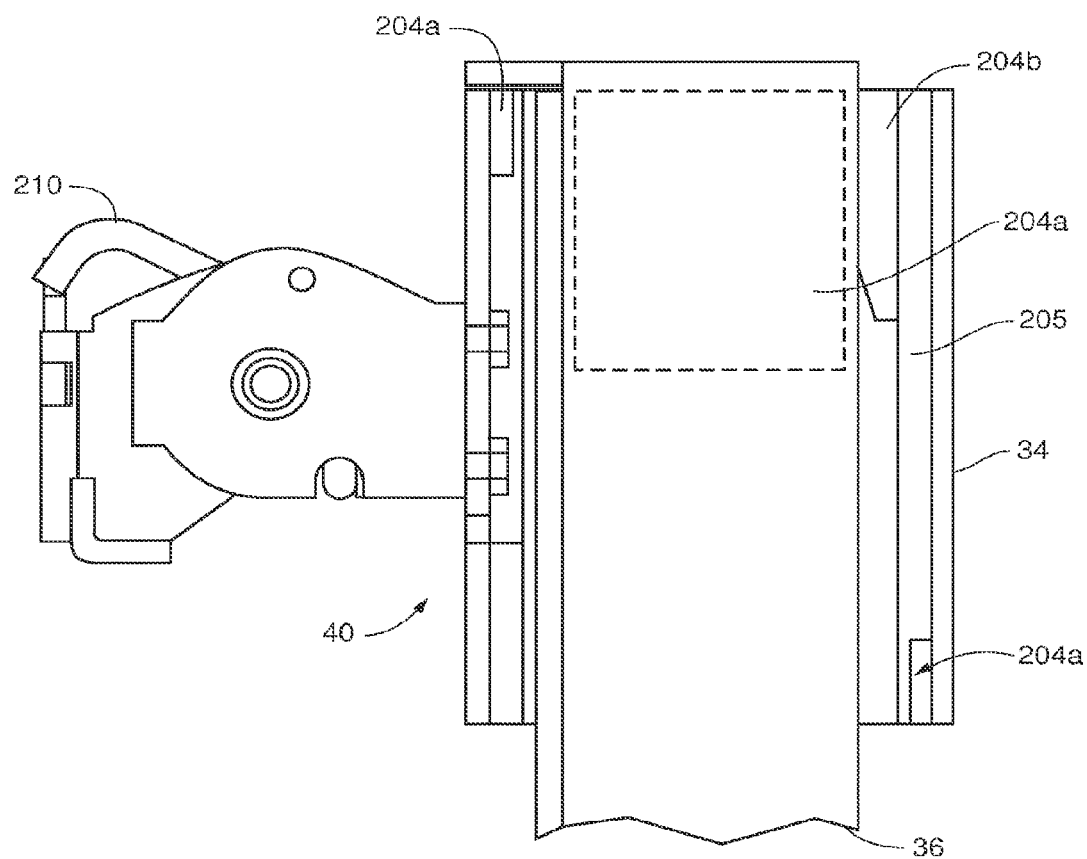

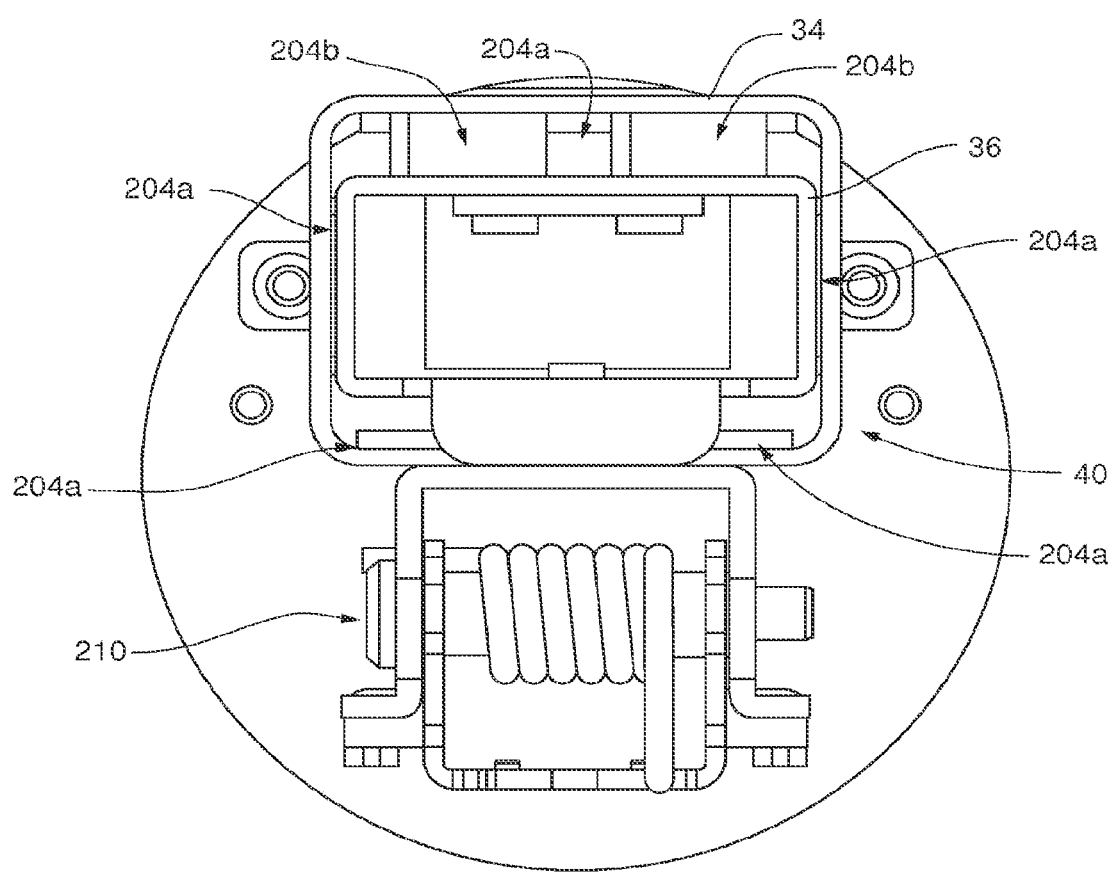

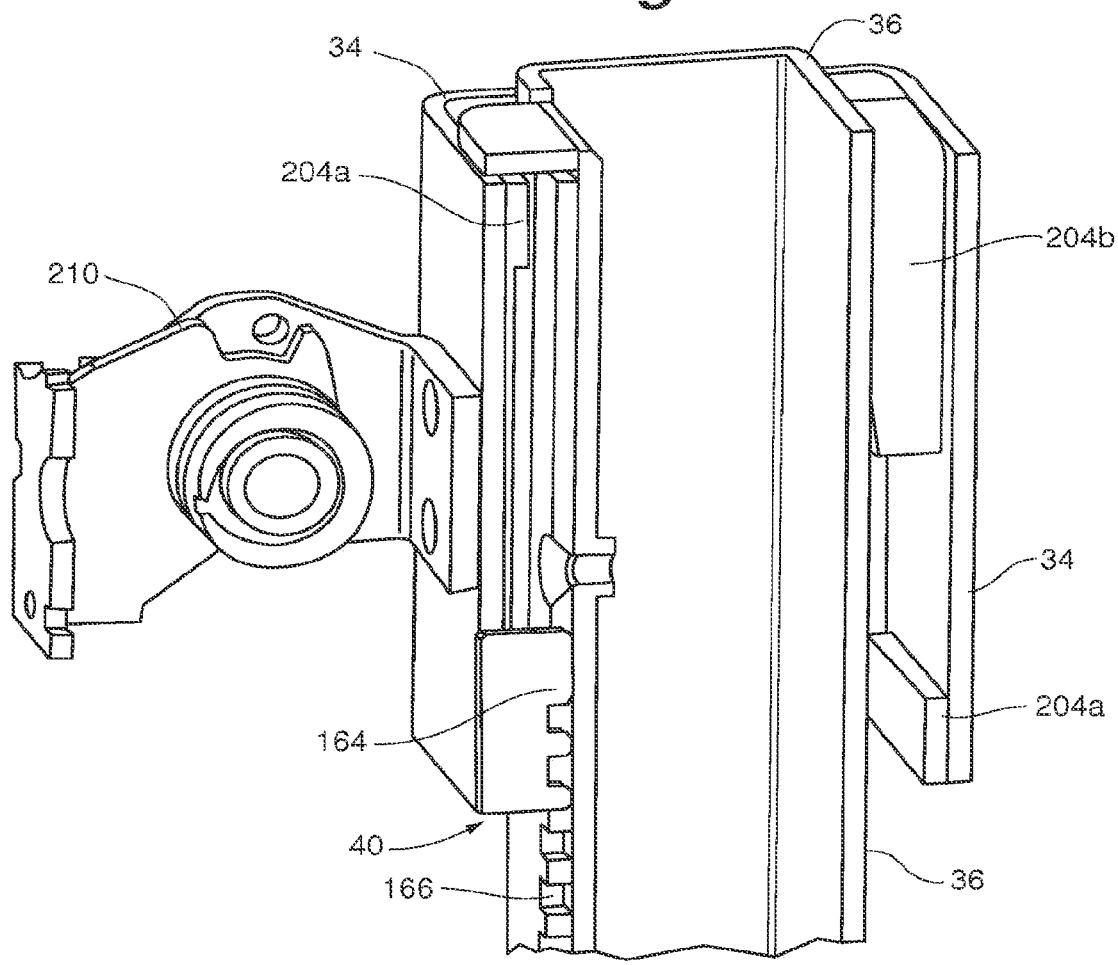

BRAKE STAND SYSTEMS

RELATED APPLICATIONS

The present application is a divisional of U.S. patent application Ser. No. 12/961,920, titled Brake Stand Systems, filed Dec. 7, 2010, which claims priority to U.S. Provisional Application Ser. No. 61/267,250, filed Dec. 7, 2009, the contents of each of which are hereby incorporated by reference.

FIELD

The invention generally relates to stands for supporting electronic displays.

BACKGROUND

Known height adjustable stands for electronic displays typically come in two varieties. The first requires the user to supply all the force necessary to adjust the height of the stand (i.e., the stands of this type are not counterbalanced). Generally, these stands provide some type of clamping device directly behind the display. Since the clamp is in an area that is hard to reach, users do not generally adjust the height of the stand to position the display at its best ergonomic position. Instead, they pick a height when initially setting up the system and do not adjust the height thereafter because of the difficulty in reaching the clamp.

Height adjustable stands of the other common type provide counterbalancing forces to help the user lift and hold the weight of the display. These types of stands are popular for holding heavy displays (e.g., displays weighing more than about 3 kilograms) and/or multiple displays. Generally, the display is held in position wherever the user sets it, without the user having to unlock clamps or engage pin locks. Although counterbalanced stands are desirable for these heavier displays, they are actually disadvantageous when holding light displays, such as those weighing less than about 3 kilograms.

For light displays, the weight of the display can be about the same as the amount of friction inherent in a counterbalancing mechanism. In such circumstances, the counterbalancing mechanism will not hold the display position because there is essentially no weight to counterbalance. Accordingly, the height of the display will tend to creep up to the maximum height allowed by the stand because of the forces from the counterbalancing mechanism acting upon it. Another problem with using counterbalancing mechanisms for extremely light displays is that when a user attempts to adjust the height of the display in an upward direction, the entire stand lifts off the support surface rather than acting against the counterbalancing mechanism. This happens because the friction within the counterbalancing system is nearly equal to the weight of the display. These problems are likely to only get worse as display technology advances and ever lighter displays are commercialized and adopted.

SUMMARY

In some embodiments, the invention includes a stand for an electronic display. In general, the electronic displays are relatively light for their screen size. For example, electronic displays particularly useful with the stands described herein can be about 0.25 kilograms to about 3 kilograms.

The stands have a first portion ultimately coupled to the display and that is adapted to move vertically along with the display relative to a fixed second portion of the stand. Accordingly, the vertical position of the display can be adjusted to provide for ergonomic positioning.

Embodiments of the stand also include a brake mechanism to selectively fix the position of the first portion relative to the second portion at a desired vertical position. In some embodiments, an actuator is provided to selectively lock and unlock the brake mechanism. Unlike the prior art mechanisms discussed above, the actuator is not located behind the screen where the first portion and the second portion connect. Rather, the actuator is proximate an outer edge of the display. Accordingly, a user can actuate the actuator while grasping the display with the same hand that is grasping the display. In other embodiments, the display itself acts as the actuator, such that the brake mechanism is locked and unlocked by tilting the display. This is a significant improvement over prior art stands that require the user to reach behind the display to undo a clamp to change the vertical height of the stand. Having the actuator in the described position allows for a user to easily unlock the brake and adjust the display's height by simply grasping the display about its outer edge in a natural manner.

When the brake is unlocked the relative vertical position between the first and second portions is solely adjustable by application of an external force applied by the user. That is, there are no counterbalancing systems that help support the weight of the display. Because the invention is particularly useful for displays weighting between about 0.25 kilograms and 3 kilograms, such counterbalancing, which is often very desirable for traditional and relatively heavy display technology, is detrimental as described above.

Embodiments of the invention eliminate the problems associated with both types of prior art stands in that they have the convenience and ease of use of a counterbalanced stand, but do not have the problems associated with counterbalanced stands when used with relatively light displays.

BRIEF DESCRIPTION OF THE DRAWINGS

The following drawings are illustrative of particular embodiments of the present invention and therefore do not limit the scope of the invention. The drawings are not to scale (unless so stated) and are intended for use in conjunction with the explanations in the following detailed description. Embodiments of the present invention will hereinafter be described in conjunction with the appended drawings, wherein like numerals denote like elements.

FIG. 1 *b* includes a front perspective view of a stand in accordance with an embodiment of the invention.

FIG. 1 *c* includes a rear perspective view of a stand with a display in a first position in accordance with an embodiment of the invention.

FIG. 1 *d* includes a rear perspective view of a stand with a display in a second position in accordance with an embodiment of the invention.

FIG. 2 includes a close-up see-through rear perspective view of a brake mechanism in accordance with the embodiment of FIGS. 1 *c-d*.

FIG. 3 includes a side plan view of a stand in accordance with an embodiment of the invention.

FIG. 4 *a* includes a rear perspective view of a stand in accordance with an embodiment of the invention.

FIG. 4 *b* includes a rear perspective view of a stand in accordance with the embodiment of FIG. 4 *a*.

FIG. 5 includes another perspective view of a brake mechanism in accordance with the embodiment of FIGS. 4 *a* and *b*.

FIG. 6 *a* includes a rear perspective view of a stand in accordance with an embodiment of the invention.

FIG. 6 *b* includes a rear perspective view of a stand in accordance with the embodiment of FIG. 6 *a*.

FIG. 7 includes another perspective view of a brake mechanism in accordance with the embodiment of FIGS. 6 *a* and *b*.

FIG. 8 includes another perspective view of a brake mechanism in accordance with the embodiment of FIGS. 6 *a* and *b*.

FIG. 9 includes a side plan view of a stand in accordance with an embodiment of the invention.

FIG. 10 includes a side plan view of a stand in accordance with an embodiment of the invention.

FIG. 11 *b* includes a cross-sectional front perspective view of a stand in accordance with the embodiment of FIG. 11 *a*.

FIG. 12 *b* includes a front perspective view of a stand in accordance with an embodiment of the invention.

FIG. 12 *c* includes a side cut-away view of a stand in accordance with an embodiment of the invention.

FIG. 12 *d* includes a front perspective view of a stand in accordance with an embodiment of the invention.

FIG. 12 *e* includes a side plan view of the stand of FIG. 12 *d* in a first vertical position.

FIG. 12 *f* includes a side plan view of the stand of FIG. 12 *d* in a second vertical position.

FIG. 12 *g* includes a side cut-away view of the stand of FIG. 12 *d* in an unlocked position.

FIG. 12 *h* includes a side cut-away view of the stand of FIG. 12 *d* in a locked position.

FIG. 12 *i* includes a top plan view of the stand of FIG. 12 *d*.

FIG. 12 *j* includes a perspective cut-away view of the stand of FIG. 12 *d*.

FIG. 13 *b* includes a side plan view of a stand in a second position in accordance with an embodiment of the invention.

FIG. 13 *c* includes a side plan view of a stand in a third position in accordance with an embodiment of the invention.

FIG. 13 *d* includes a side plan view of a stand in a fourth position in accordance with an embodiment of the invention.

FIG. 14 *b* includes a side plan view of a stand in a second position in accordance with an embodiment of the invention.

FIG. 14 *c* includes a side plan view of a stand in a third position in accordance with an embodiment of the invention.

FIG. 14 *d* includes a side plan view of a stand in a fourth position in accordance with an embodiment of the invention.

FIG. 15 *b* includes a side plan view of a stand in a second position in accordance with an embodiment of the invention.

FIG. 15 *c* includes a side plan view of a stand in a third position in accordance with an embodiment of the invention.

FIG. 15 *d* includes a side plan view of a stand in a fourth position in accordance with an embodiment of the invention.

FIG. 16 *b* includes a side plan view of a stand in a second position in accordance with an embodiment of the invention.

FIG. 16 *c* includes a side plan view of a stand in a third position in accordance with an embodiment of the invention.

FIG. 16 *d* includes a side plan view of a stand in a fourth position in accordance with an embodiment of the invention.

FIG. 17 *b* includes a side plan view of a stand in a second position in accordance with an embodiment of the invention.

FIG. 18 *b* includes a rear plan view of a stand in accordance with an embodiment of the invention.

FIG. 18 *c* includes a side plan view of a stand in accordance with an embodiment of the invention.

FIG. 18 *d* includes a side plan view of a stand in accordance with an embodiment of the invention.

FIG. 18 *e* includes a side plan view of a stand in accordance with an embodiment of the invention.

FIG. 18 *f* includes a side plan view of a stand in accordance with an embodiment of the invention.

FIG. 18 *g* includes a side plan view of a stand in accordance with an embodiment of the invention.

FIG. 18 *h* includes a side plan view of a stand in accordance with an embodiment of the invention.

FIG. 18 *i* includes a side plan view of a stand in accordance with an embodiment of the invention.

FIG. 18 *j* includes a perspective view of a base in accordance with an embodiment of the invention.

FIG. 18 *k* includes a perspective view of a base in accordance with an embodiment of the invention.

FIG. 18 *l* includes a front perspective view of a stand in accordance with an embodiment of the invention.

FIG. 18 *m* includes a front perspective view of a stand in accordance with an embodiment of the invention.

FIG. 19 *b* includes a side plan view of a stand in accordance with an embodiment of the invention.

FIG. 19 *c* includes a side plan view of a stand in accordance with an embodiment of the invention.

FIG. 19 *d* includes a side plan view of a stand in accordance with an embodiment of the invention.

FIG. 19 *e* includes a side plan view of a stand in accordance with an embodiment of the invention.

FIG. 19 *f* includes a side plan view of a stand in accordance with an embodiment of the invention.

DETAILED DESCRIPTION OF THE PREFERRED EMBODIMENTS

The following detailed description is exemplary in nature and is not intended to limit the scope, applicability, or configuration of the invention in any way. Rather, the following description provides some practical illustrations for implementing exemplary embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

In some embodiments, the invention includes a stand 10 for an electronic display 20. In general, the electronic displays are relatively light for their screen size. For example, electronic displays particularly useful with the stands described herein can be about 0.25 kilograms to about 3 kilograms. Typically, these types of electronic displays will employ organic light emitting diode or similar lightweight technology.

Figure 1B:
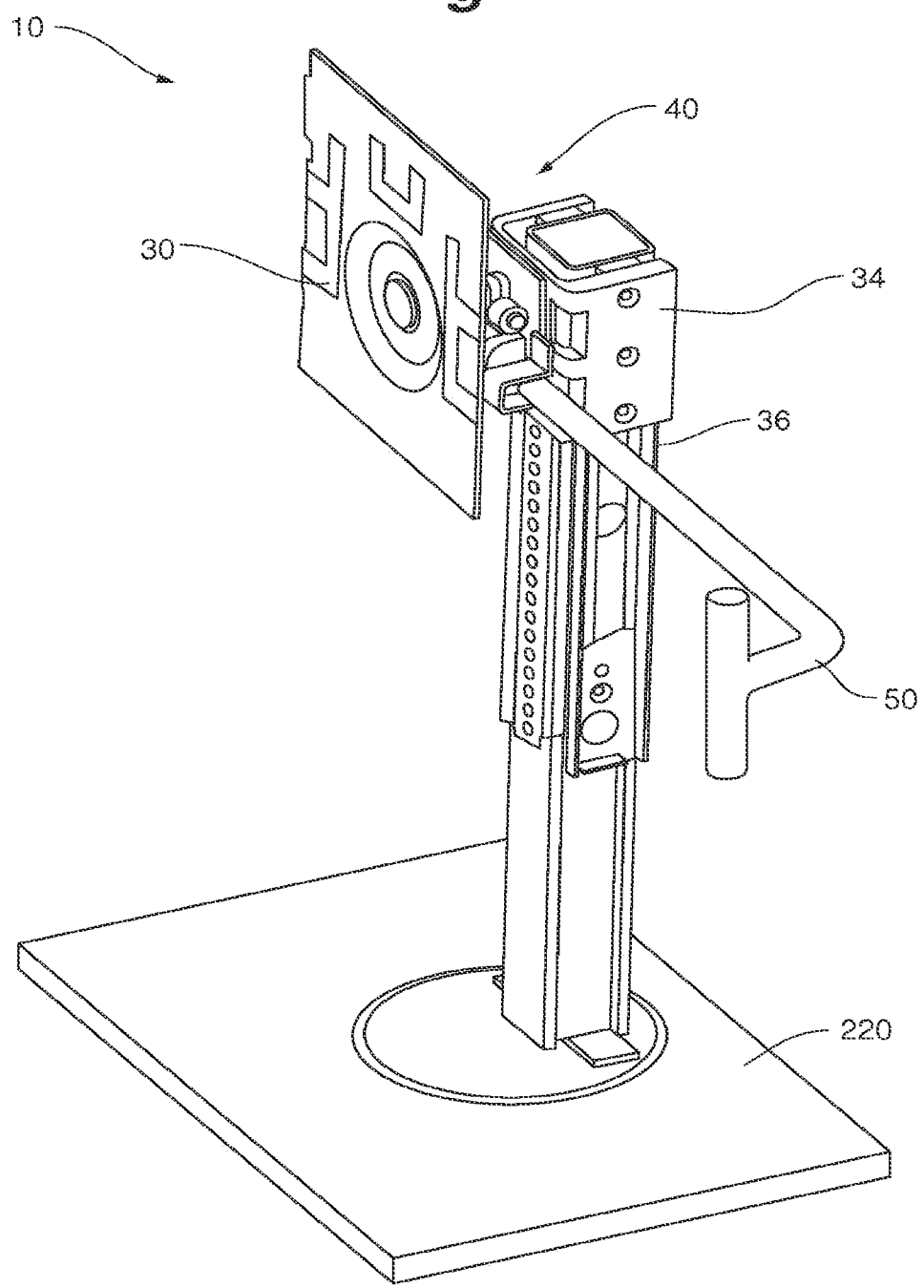
FIG. 1 *a* includes a front perspective view of a stand in accordance with an embodiment of the invention.

As shown best in FIGS. 1 *a*-2, embodiments of the stand 10 include an interface 30 to attach the display 20 to the stand 10.

In some embodiments, the interface 30 is a Video Electronics Standards Association (VESA) complaint connection. As shown, the interface 30 can be attached to a first portion 34 of the stand 10 that is adapted to move vertically along with the display 20 relative to a fixed second portion 36 of the stand 10. Accordingly, the vertical position of the display 20 can be adjusted. Such a vertical adjustment provides important ergonomic benefits by allowing a user to correctly align the vertical position of the monitor to an ergonomically correct position relative to the user.

Also as shown in Figures, embodiments of the stand 10 include a brake mechanism 40 to selectively fix the position of the first portion 34 relative to the second portion 36 at a desired vertical position. The brake is selectively lockable and unlockable. When the brake is locked the relative vertical position between the first and second portions, and therefore the display 20, is maintained. Correspondingly, when the brake is unlocked the relative vertical position of the display 20 may be adjusted.

In a first embodiment of the invention, as shown in FIGS. 1a-11b, an actuator 50 is provided to selectively lock and unlock the brake mechanism 40. Unlike prior art mechanisms, the actuator 50 is not located behind the screen where the first portion 34 and the second portion 36 connect. Rather, the actuator 50 is proximate an outer edge 60 (i.e., the edge extending about the perimeter (the right, left, top, and bottom of the display) of the display between the screen side and the side opposite the screen side of the display of the electronic display 20). Accordingly, a user can actuate the actuator 50 while grasping the display 20 with the same hand that is grasping the display 20. This is a significant improvement over prior art stands that require the user to reach behind the display to undo a clamp to change the vertical height of the stand. Since such an operation is awkward, many users would not bother to change the height of the stand after the system was initially set and would view the display from an ergonomically incorrect position. Having the actuator 50 in the described position allows for a user to easily unlock the brake and adjust the display's height by simply grasping the display about its outer edge 60 in a natural manner, which also actuates the actuator 50 since it is positioned proximate the outer edge 60 of the display 20.

The actuator 50 itself can be any structure useful for actuating the brake, such as a handle or lever end. In some embodiments, the actuator 50 is positioned and aligned such that is it easy to actuate when a user grasps the display 20 to reposition it. In some embodiments, the actuator is a lever extending several inches from the brake mechanism 40. In the embodiment shown in FIG. 1a, the actuator extends downward from the brake mechanism. In the embodiment shown in FIG. 1b, the actuator extends to a side of the brake mechanism. In both embodiments, an end of the actuator is positioned proximate the outer edge 60 of a display attached to the stand 10 (the display is not shown in FIG. 1a or b). For example, an end of the actuator may extend at least about 3 inches from the brake mechanism, and/or extend to within about 3 inches of the outer edge of the display. The actuator may be positioned behind the display, yet extend to or near a plane defined by the outer edge of the display. In other embodiments, the actuator may extend past a plane defined by the outer edge of the display. In yet other embodiments, the actuator may extend past a plane defined by the outer edge of the display and forward past a plane defined by a rear surface of the display.

Figure 1C:
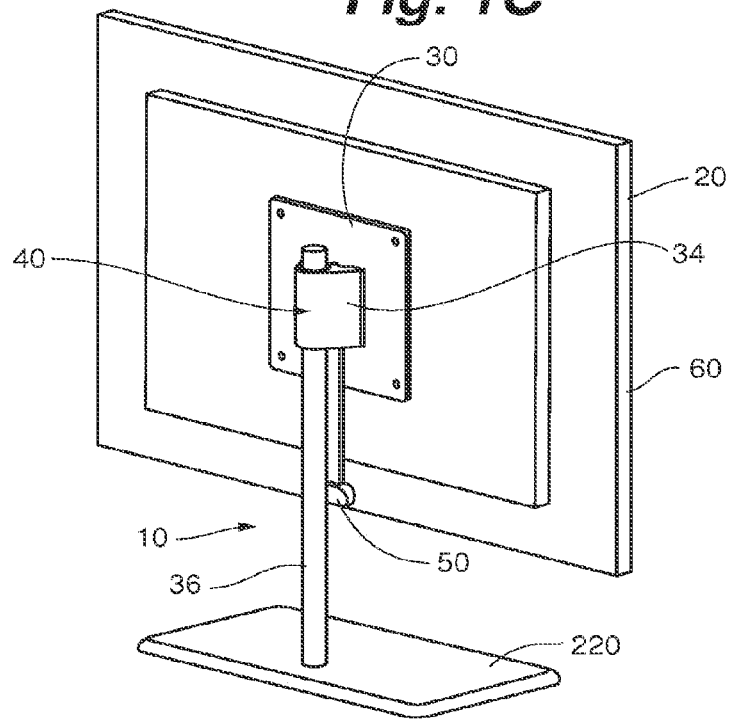
Figure 1D:
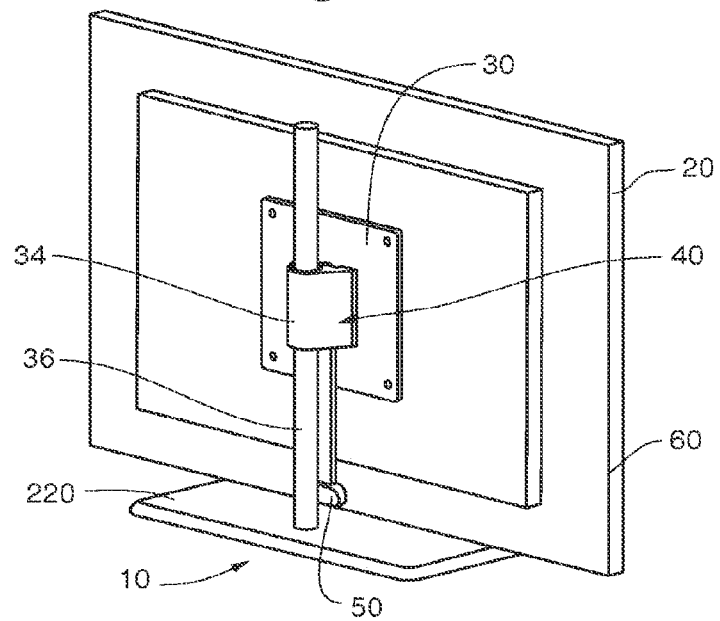

The actuator is useful for selectively locking and unlocking the brake mechanism to allow for positioning of the display. FIG. 1c shows a stand 10 supporting a display 20 in a first vertical position, and FIG. 1d shows the stand 10 supporting the display 20 in a second vertical position. When the brake is unlocked the relative vertical position between the first and second portions is solely adjustable by application of an external force. That is, there are no counterbalancing systems that help support the weight of the display 20 or the first portion 34. Because the invention is particularly useful for displays weighting between about 0.25 kilograms and 3 kilograms, such counterbalancing, which is often very desirable for traditional and relatively heavy display technology such as liquid crystal displays, is detrimental. For example, in some cases the weight of a light display is about the same as, or even less than, the amount of friction inherent in a counterbalancing mechanism. In such circumstances, the counterbalancing mechanism will not hold the display 20's position because there is essentially no weight to counterbalance. Accordingly, the height of the display 20 will tend to creep up to the maximum height allowed by the stand because of the forces from the counterbalancing mechanism acting upon it. Another problem with using counterbalancing mechanisms for extremely light displays is that when a user attempts to adjust the height of the display in an upward direction, the entire stand lifts off the support surface rather than acting against the counterbalancing mechanism. This happens because the friction within the counterbalancing system is nearly equal to the weight of a very light display.

The brake mechanism 40 itself may take many forms. For example, as shown in FIGS. 1c-d and 2, a torsion spring brake may be provided. In such an embodiment, the second portion 36 of the stand 10 includes a vertical pole and the first portion 34 of the stand 10 connects the interface 30 to the pole. As shown in FIG. 2, the brake mechanism 40 can include at least one torsion spring 70 wrapped around the pole. In such embodiments, the torsion spring 70 has an inner diameter smaller than an outer diameter of the pole when the spring is in its relaxed state to provide sufficient frictional forces to maintain the relative vertical position of the first and second portions when the spring is in its relaxed state. Further, the brake mechanism 40 can include a fixed collar 80 to hold a first leg 84 of the torsion spring 70 in a fixed position relative to the first portion 34, and a selectively rotatable collar 90 to hold a second leg 94 of the torsion spring 70 in a selectively rotatable position with respect to the first portion 34. In such embodiments, the fixed and rotatable collars are received around the pole, and the mechanism further includes an actuator 50 (e.g., a release lever) located proximate the outer edge 60 of the display 20 to selectively rotate the rotatable collar with respect to the first portion 34 such that when the actuator 50 is actuated the rotatable collar is rotated with respect to the first portion 34 to partially unwind the torsion spring from its relaxed state. This partial unwinding increases the inner diameter of the spring to reduce the frictional forces between the spring and the pole, thereby allowing the first portion 34 to move relative to the pole such that the vertical position of the display 20 can be adjusted at an infinite number of vertical positions along the pole.

Another embodiment of the brake mechanism 40 includes a cam brake, as shown in FIG. 3. In such an embodiment, the brake mechanism 40 includes a cam-shaped brake pad 100 carried by the first portion 34. The cam-shaped brake pad is biased to interact with the second portion 36 to lock the brake and fix relative movement between the first portion 34 and the second portion 36. In some embodiments, such a brake mechanism 40 further includes an actuator 50 located proximate an outer edge 60 of the display 20 to disengage the cam-shaped brake pad from the second portion 36 such that the position of the display 20 can be adjusted at an infinite number of vertical positions along the second portion 36. In some embodiments, the cam-shaped brake member is biased against the second portion 36 by gravity. In other embodiments, the cam-shaped brake member is biased against the second portion 36 by a spring (not shown).

Embodiments of brake mechanisms 40 also include a vice clamp brake, as shown in FIGS. 4 *a*-8. In such embodiments, the brake can include a vice clamp having a clamp bar 110 with an aperture that is biased (e.g., via a spring) to receive and bind against the second portion 36. Further, the clamp bar can be urged against the bias with a pivoting bar 120 attached to a cable 130, the cable being connected to the actuator 50 located proximate the outer edge 60 of the display 20. Multiple actuators 50 may be provided at different locations proximate the outer edge 60 of the display 20 to provide a user with several actuation locations.

As shown in FIGS. 4 *a*-5, one embodiment of a vice clamp brake includes a single direction vice clamp, such that the brake, when locked, prohibits movement of the first portion 34 relative to the second portion 36 only in the downward direction. In such an embodiment, the user simply moves the display 20 upward if desired without having to actuate the brake. The clamp bar will give and ride along the second portion 36 because of the force direction. However, when the external force is removed the weight of the display 20 will be enough to cause the bar to bind against the second portion 36.

In other embodiments, as shown in FIGS. 6 *a*-8, the brake includes a dual direction vice clamp, such that the brake, when locked, prohibits movement of the first portion 34 relative to the second portion 36 in the downward direction and the upward direction. Accordingly, for this embodiment, a user must actuate an actuator 50 to unlock the brake regardless of whether the user desired to move the display 20 upward or downward.

As shown in FIGS. 9-10, some embodiments of the brake mechanism 40 include a spring with an engagement member carried by the first portion 34. In such embodiments, the engagement member 140 is biased by the spring to interact with a surface of the second portion 36. As shown, one of the engagement member or the surface 150 of the second portion 36 includes a male fitting (e.g., tab or teeth) or a female fitting (e.g., slots or teeth receiving grooves), and the other of the engagement member or the surface of the second portion 36 comprises the other of the male fitting or female fitting. In such embodiments, the position of the display 20 can be adjusted at a discrete number of vertical positions along the second portion 36 corresponding to the interaction locations of the male and female fittings. The bias of a spring 160 (e.g., a flexible member) can cause the engagement member to interact with the surface of the second portion 36 to fix the vertical position of the first portion 34 to the second portion 36. An actuator 50 (e.g., handle portion) can be provided to move the spring and thereby disengage the engagement portion with the surface of the second portion 36 such that the vertical position of the display 20 can be adjusted at discrete vertical positions along the second portion 36. The positions correspond to the interaction locations of the male and female fittings. In some embodiments, as shown in FIG. 10, the male fitting includes a tab and the female fitting includes a slot to receive the tab. In other embodiments, as shown in FIG. 9, the male fitting includes a plurality of teeth and the female fitting includes a plurality of teeth receiving grooves to receive the teeth.

Figure 11A:
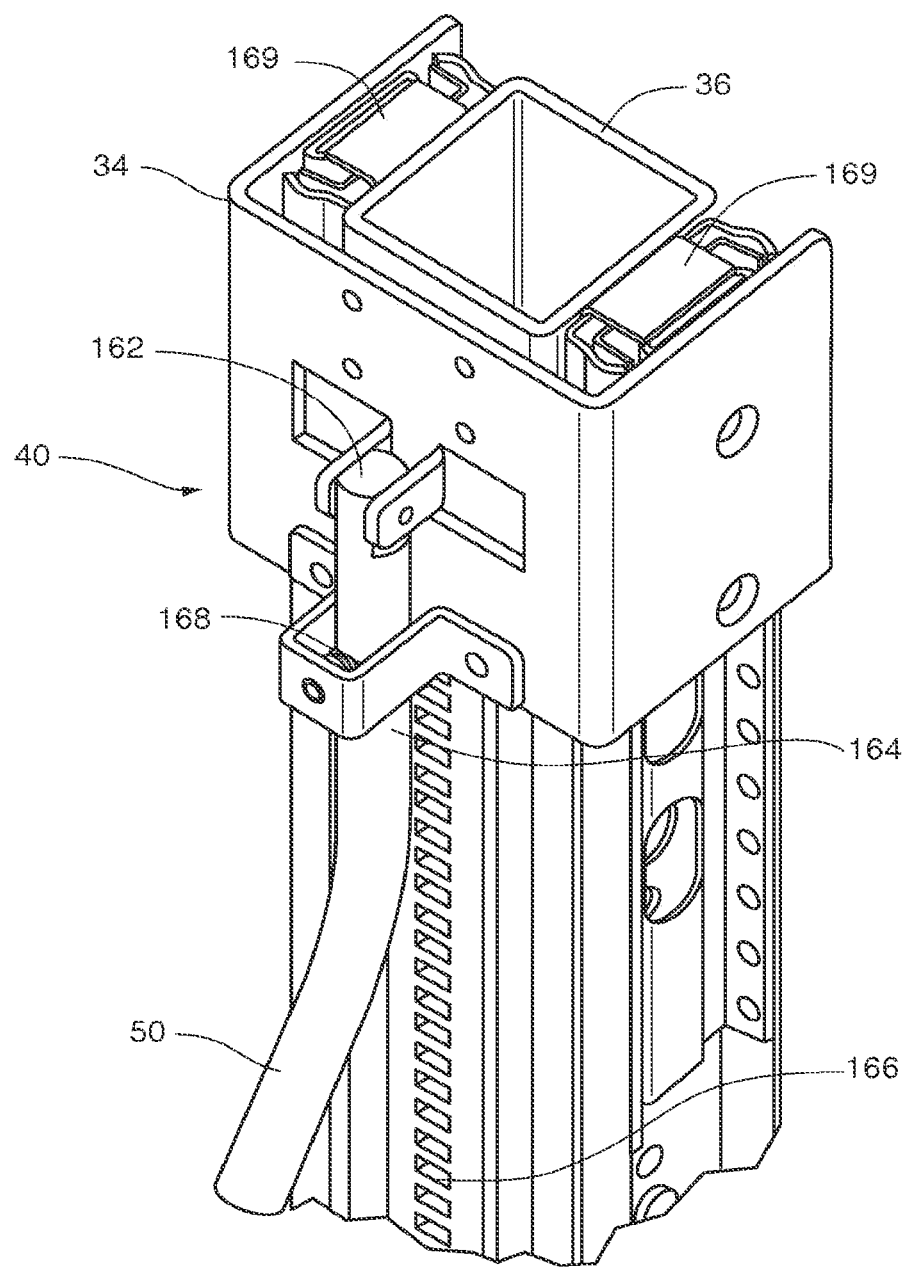
FIG. 11 *a* includes a front perspective view of a stand in accordance with an embodiment of the invention.

Another embodiment of a brake mechanism 40 is shown in FIGS. 11 *a* and *b*. In this embodiment, the actuator is pivotably coupled to the first portion via an actuator pivot mechanism 162. The actuator also includes a male fitting 164 (e.g., tabs or teeth) that are selectively engagable with a series of female fittings 166 (e.g., slots or teeth receiving grooves) included in the second portion. Of course, this arrangement could be reversed, with the actuator including a female fitting and the second portion including a male fitting. In such an embodiment, the portion of the actuator having the male or female fitting can be considered part of the brake mechanism. As shown, a spring 168 (e.g., a compression spring) can be provided to bias the male fitting into the female fitting to lock the position of the first portion relative to the second portion. In the embodiment shown in FIGS. 11 *a* and *b*, the first portion is coupled to the second portion via first and second slides 169 that facilitate controlled adjustability when the male fittings are not engaged with the female fittings.

FIG. 11 *b* shows such a brake mechanism coupled to a display 20. As shown, the actuator 50 is located proximate an edge 60 of the display, such that a user could grasp the display and actuate the actuator with a single hand. FIG. 11 *b* also shows a display tilt mechanism 210 coupled to the first portion 34. The display tilt allows for the tilt angle of the display to be adjusted to a desired position, and is independently adjustable of the actuator pivot mechanism.

Figure 12A:
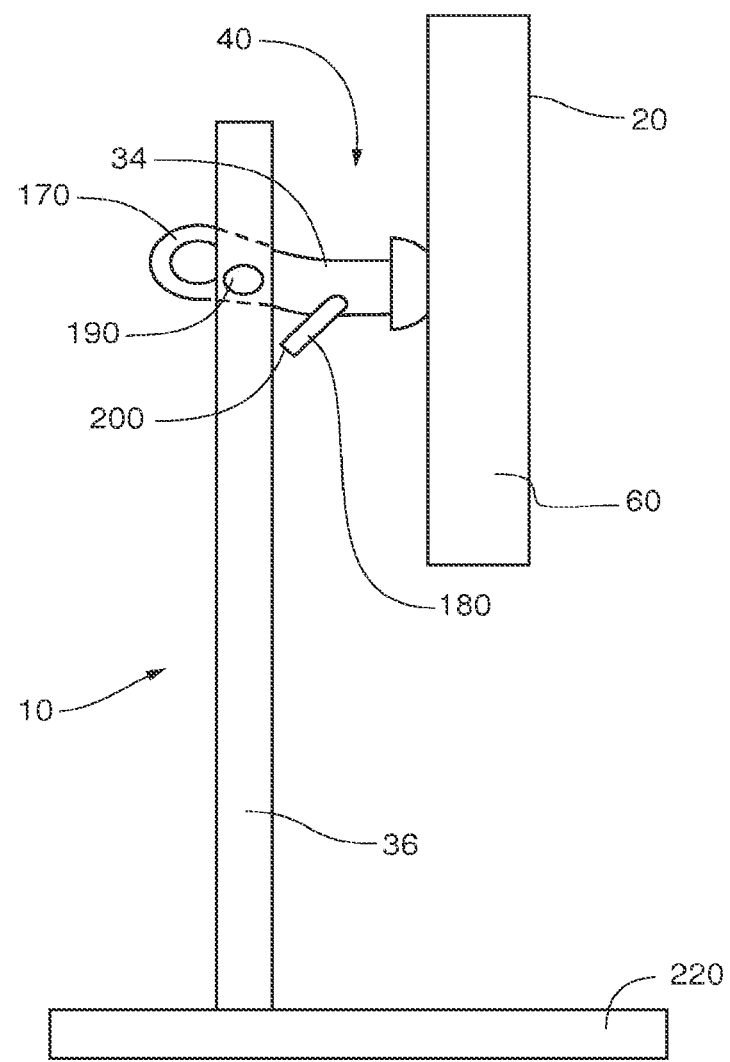
FIG. 12 *a* includes a side plan view of a stand in accordance with an embodiment of the invention.
Figure 12B:
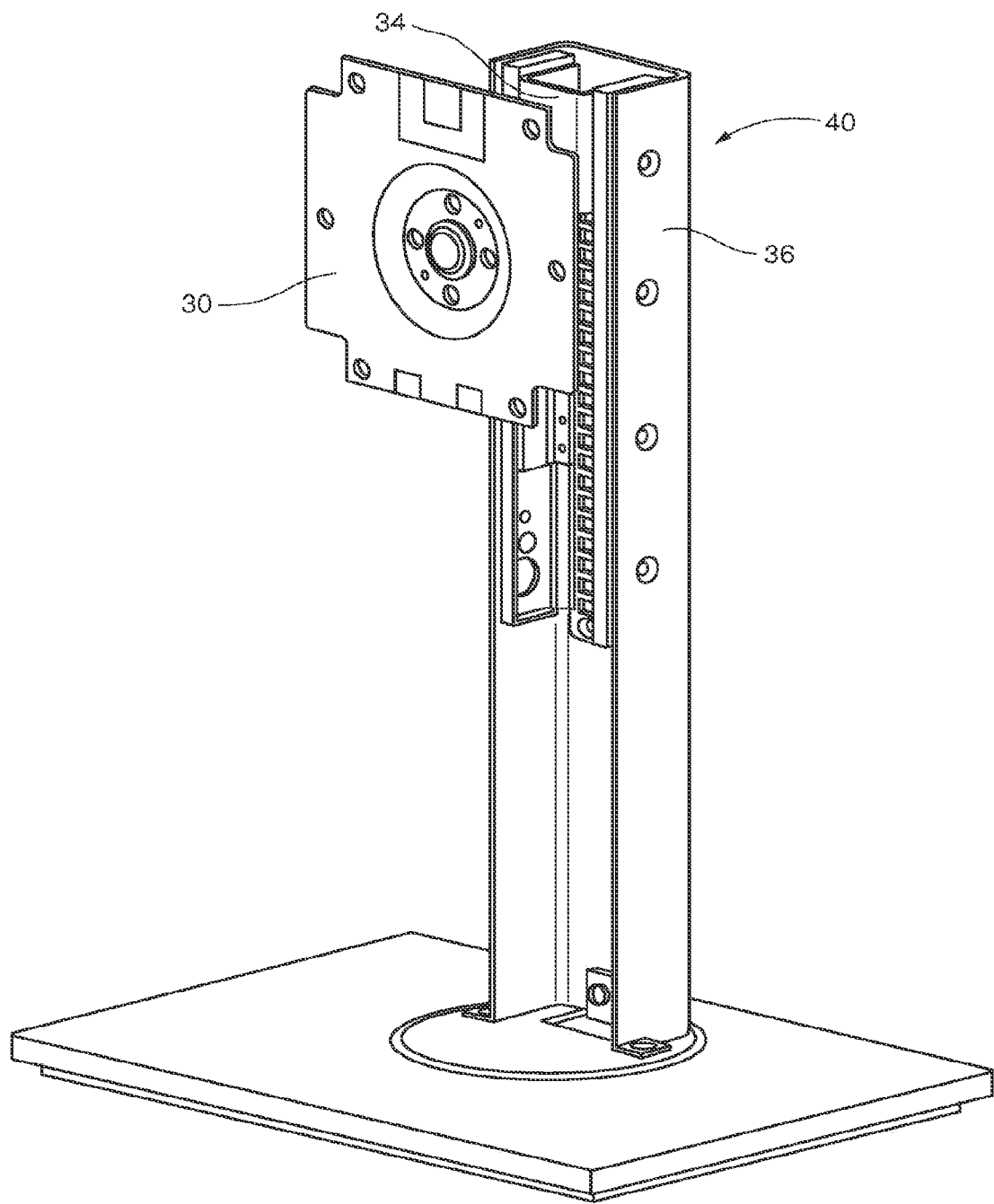
Figure 13A:
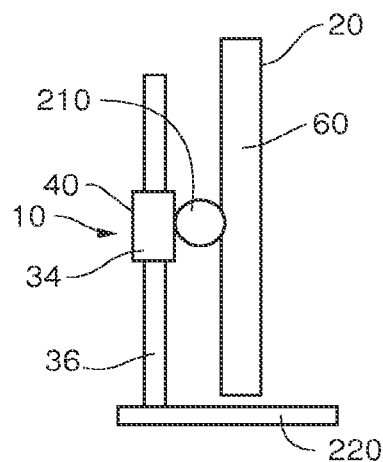
FIG. 13 *a* includes a side plan view of a stand in a first position in accordance with an embodiment of the invention.
Figure 13B:
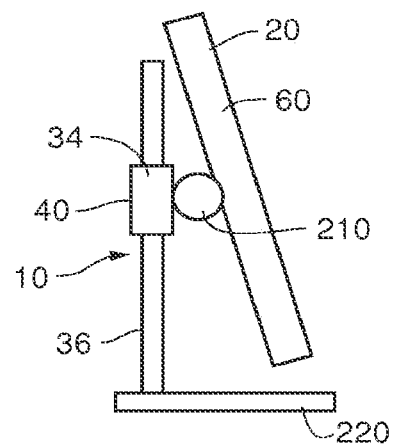
Figure 13C:
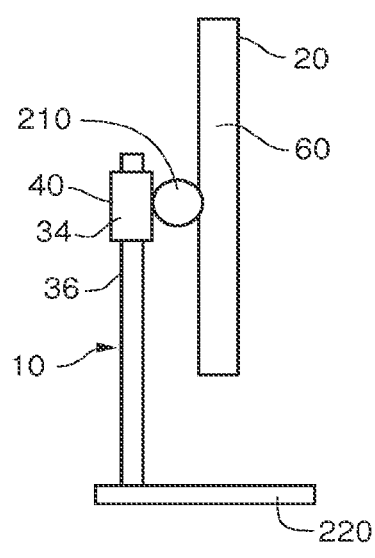
Figure 13D:
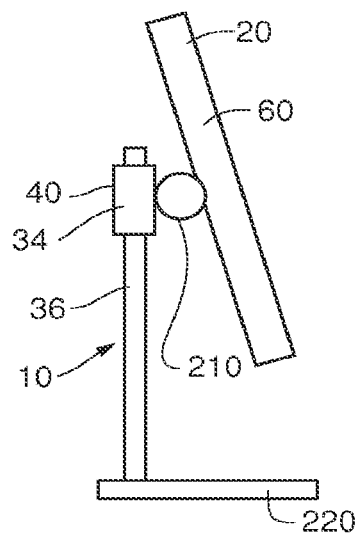
Figure 14A:
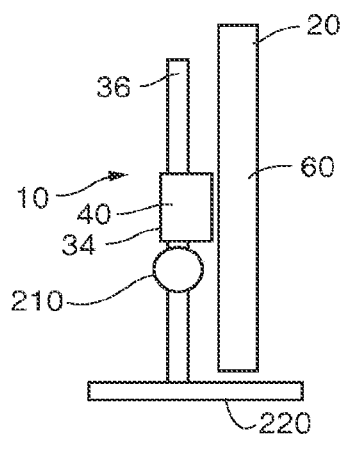
FIG. 14 *a* includes a side plan view of a stand in a first position in accordance with an embodiment of the invention.
Figure 14B:
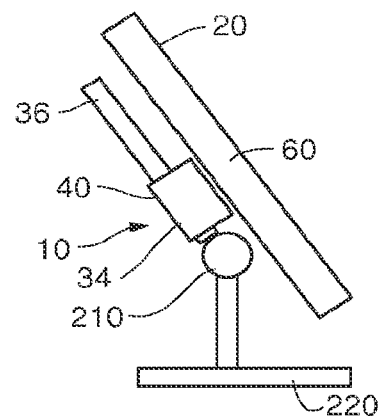
Figure 14C:
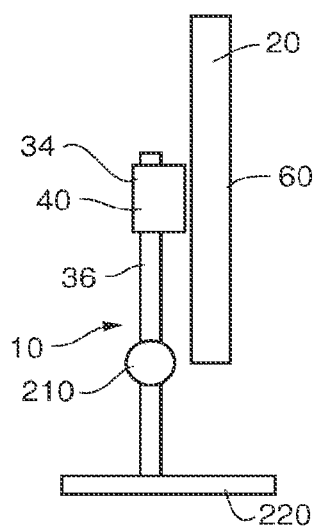
Figure 14D:
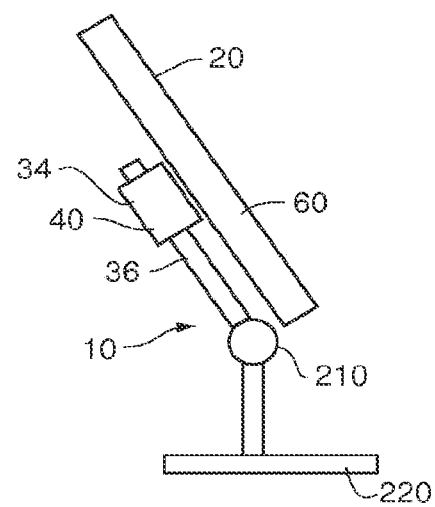
Figure 15A:
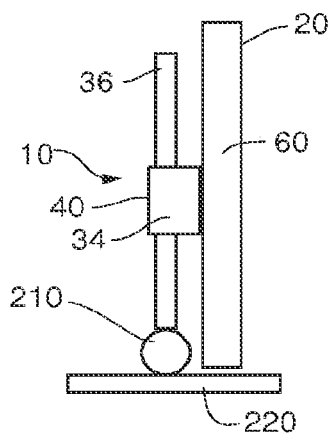
FIG. 15 *a* includes a side plan view of a stand in a first position in accordance with an embodiment of the invention.
Figure 15B:
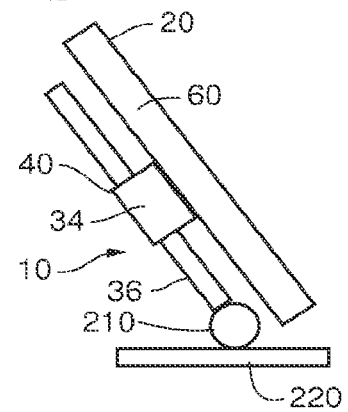
Figure 15C:
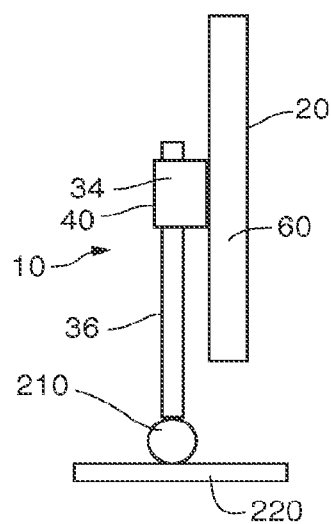
Figure 15D:
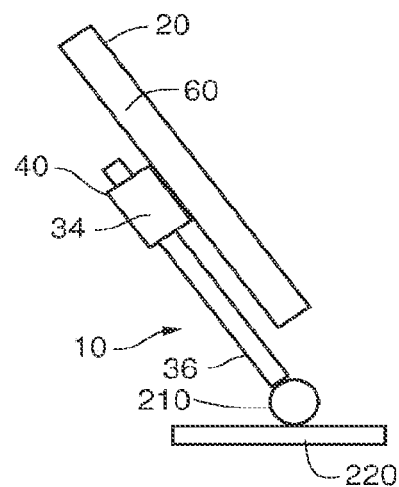
Figure 16A:
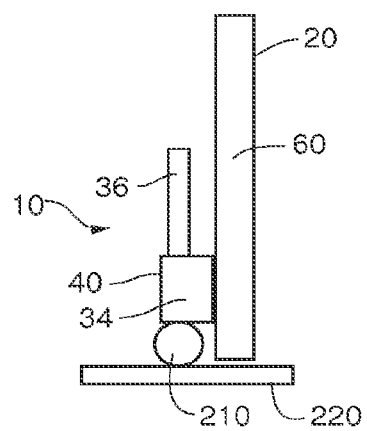
FIG. 16 *a* includes a side plan view of a stand in a first position in accordance with an embodiment of the invention.
Figure 16B:
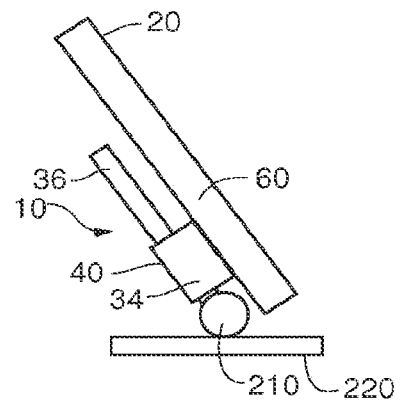
Figure 16C:
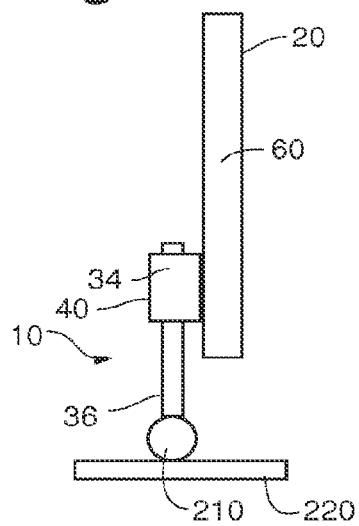
Figure 16D:
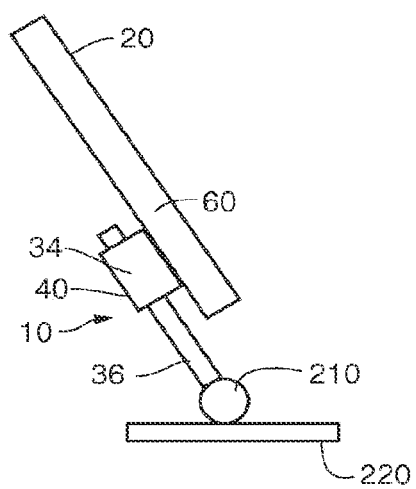

In other embodiments, the stand 10 does not include a separate actuator 50. In such embodiments, as shown in FIGS. 12 *a-j*, the brake mechanism 40 is selectively lockable and unlockable by a tilting motion of a display 20 attached to the interface 30. That is, when a user tilts the display 20 in the prescribed manner, the tilting motion itself causes selective locking and unlocking of the brake. In such an embodiment, it is the display 20 itself that acts as the actuator 50.

As shown in FIG. 12 *a*, one embodiment of this type includes a brake mechanism 40 with a first engagement member 170 carried by the first portion 34 and a second engagement member 180 carried by the first portion 34. The first engagement member is adapted to interact with a first surface 190 of the second portion 36 and the second engagement member adapted to interact with a second surface 200 of the second portion 36 (both first and second surfaces are generally integral with second portion 36, and can be found in different locations of the same surface). The second surface of the second portion 36 is approximately opposite to the first surface of the second portion 36, such that the first portion 34 is fixed relative to the second portion 36 when the brake is in its locked position. However, the vertical position of the display 20 is adjustable at vertical positions along the second portion 36 when the brake is in its unlocked position. Accordingly, the brake is moveable from its locked position to its unlocked position by disengaging the first engagement member from the first surface of the second portion 36 by lifting up or tilting back the display 20.

In some embodiments, the first and/or engagement member and/or their corresponding surfaces include a relatively high friction material (e.g., rubber) and the first surface of the second portion 36 is generally smooth. In such embodiments, the position of the display 20 can be adjusted at an infinite number of vertical positions along the second portion 36.

In other embodiments, as shown in FIGS. 12 *b* and *c*, one of the first engagement member or the first surface of the second portion 36 comprises a male fitting 164 (e.g., tabs or teeth) or a female fitting 166 (e.g., slots or teeth receiving grooves), and the other of the first engagement member or the first surface of the second portion 36 comprises the other of the male fitting or the female fitting. In such embodiments, the position of the display 20 can be adjusted at a discrete number of vertical positions along the second portion 36 corresponding to the interaction locations of the male and female fittings. As shown in FIG. 12 *c*, such a brake mechanism can also include a brake pivot mechanism 174 that allows the first portion to pivot relative to the second portion. The first portion may also include a slot 176 to receive a pin 178. Such a slot allows the first portion to pivot about the brake pivot mechanism while constraining the range of the pivot movement. In such embodiments, when a user pulls the bottom of the display or pushes the top of the display the first portion will pivot about the brake pivot mechanism and the male fittings will disengage from the female fittings and the height of the display can be adjusted. When the user's force is removed gravity will cause the display to rotate downward and reengage the male fittings with the female fittings. In the embodiment shown, first and second portions 34, 36 can be connected via one or more slides 169 to facilitate the relative movement.

Also as shown in FIG. 12 c, a display tilt mechanism 210 can be provided to allow for tilting of the display relative to the stand. The display tilt mechanism is independent of the brake pivot mechanism, such that a user can adjust a tilt angle of the display without pivoting the first portion about the brake pivot mechanism, or can pivot the first portion about the brake pivot mechanism without changing the tilt angle of the display.

Another embodiment is shown in FIG. 12 d-j. In this embodiment, first portion 34 includes male fittings 164 and second portion 36 includes female fittings 166 (as described above, this arrangement can be reversed). As shown, the first portion 34 can be shaped to extend around the perimeter of the second portion 36, and can be sized larger than the second portion to allow it to be tilted about a pivot axis with respect to the second portion. In such embodiments, a user may grasp a display connected to the first portion to tilt the first portion relative to the second portion to disengage the male fittings from the female fittings. The height of the first portion can then be adjusted relative to the second portion. FIG. 12 e shows the first portion at a first vertical location with respect to the second portion, and FIG. 12 f shows the first portion at a second vertical location with respect to the second portion. At a desired height, the user can tilt the display downward to reengage the male fittings and the female fittings to set the height of the display. FIG. 12 g shows the brake mechanism in an unlocked position with the first portion pivoted with respect to the second portion, and FIG. 12 h shows the brake mechanism in a locked position. As shown in the FIGS. 12 d-j, a display tilt mechanism 210 that is independent of the brake mechanism can also be provided to allow for desired tilting of the display.

In some embodiments, as best shown in FIGS. 12 i-j, one or more glide pads 204 are provided to facilitate relative movement between the first and second portions when the male fittings are not engaged with the female fittings. In some embodiments, one or more low friction glide pads 204 a and one ore more high friction glide pads 204 b are provided. In certain embodiments, the low friction glide pads 204 a include a polymer such as polytetrafluoroethylene (such as TEFLON), and the high friction glide pads 204 b include a polymer such as rubber. As shown in FIGS. 12 i-j, the low and high friction glide pads can be placed to facilitate relative movement between the first and second portions when desired. As shown, low friction glide pads 204 a can be included proximate the top of the first portion on the display side, and proximate the bottom of the first portion proximate the side on the opposite side of the display side. In such embodiments, the low friction glide pads 204 a will contact the second portion when the first portion is pivoted with respect to the second portion to facilitate gliding movement between the first and second portions. As shown, low friction glide pads 204 a can also be included along the side of the first or second portions. Also as shown, high friction glide pads 204 b can be positioned proximate the top of the first portion on the side opposite the display side. In such a position, the high friction glide pad 204 b will contact the second portion when the brake mechanism is in its locked position. As shown in FIGS. 12 g-h, the high friction glide pad 204 b can include an angled section 205 such that it contacts the second portion when the brake system is in both its locked and unlocked positions.

Figure 17A:
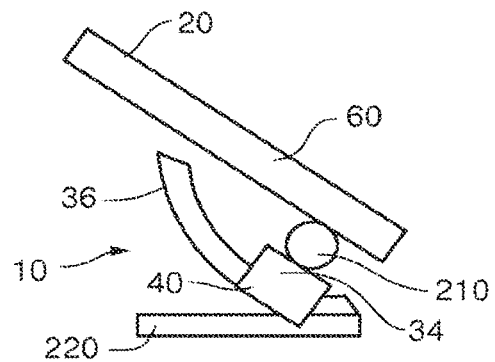
FIG. 17 *a* includes a side plan view of a stand in a first position in accordance with an embodiment of the invention.
Figure 17B:
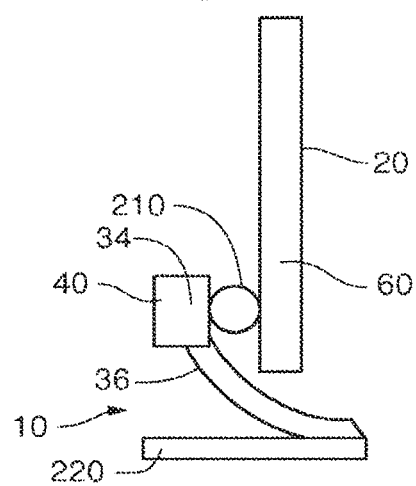
Figure 18A:
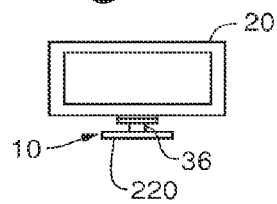
FIG. 18 *a* includes a front plan view of a stand in accordance with an embodiment of the invention.
Figure 18B:
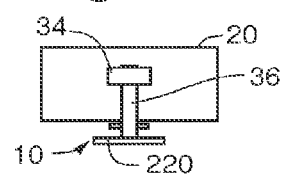
Figure 18C:
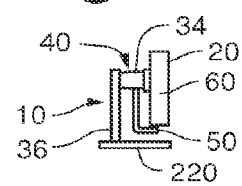
Figure 18D:
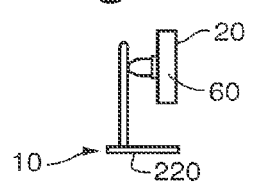
Figure 18E:
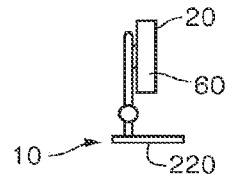
Figure 18F:
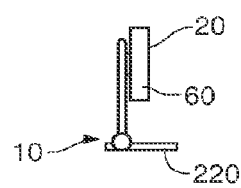
Figure 18G:
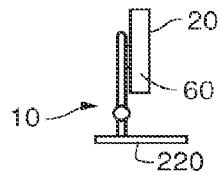
Figure 18H:
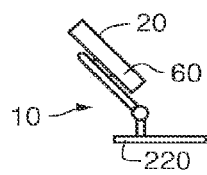
Figure 18I:
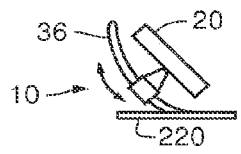
Figure 18J:
Figure 18K:
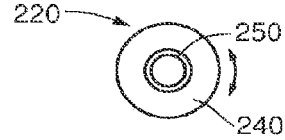
Figure 18L:
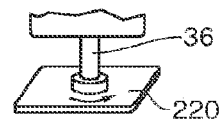
Figure 18M:
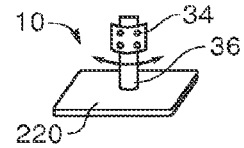
Figure 19A:
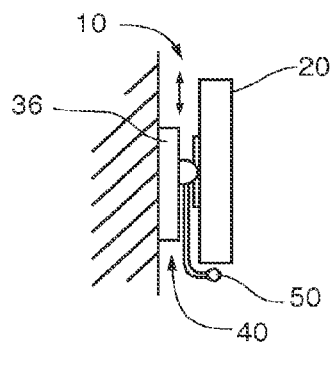
FIG. 19 *a* includes a side plan view of a stand in accordance with an embodiment of the invention.
Figure 19B:
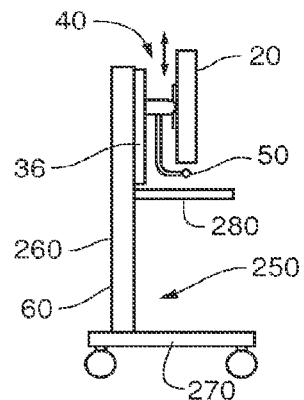
Figure 19C:
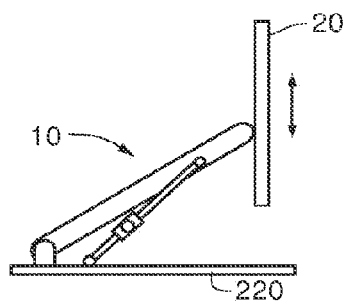
Figure 19D:
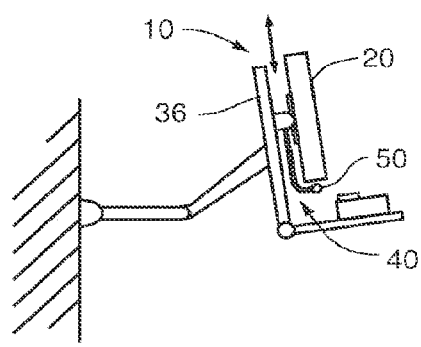
Figure 19E:
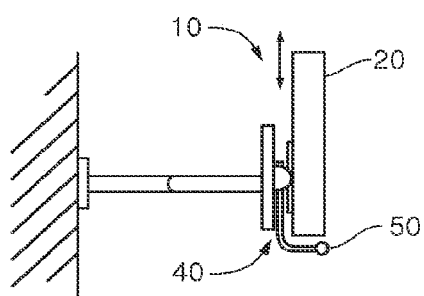
Figure 19F:
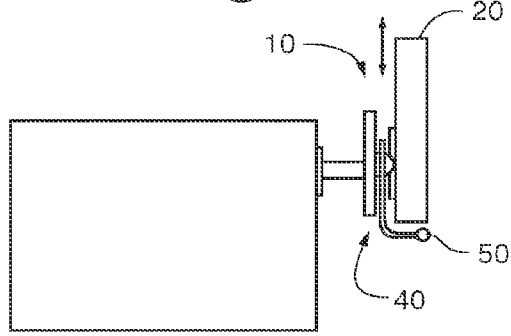

The stand can take any suitable form. As shown, for example, in FIGS. 13 a-16 d, and 18 a-h, in some embodiments of the stand 10 the second portion 36 is a generally vertical elongated member and the first portion 34 travels in a generally straight path as it travels along the second portion 36. In other embodiments, as shown in FIGS. 17 a-b and 18 i, the second portion 36 is curved and the first portion 34 travels in a generally curved path as it travels along the second portion 36.

As shown, for example, in FIGS. 11 b, 12 c, 13 a-17 b and 18 d-i, some embodiments of the stand 10 include a display tilt mechanism 210 to provide tilting capabilities to the display. In some embodiments, the display tilt mechanism 210 allows for tilting angles of about 40 degrees. The stand 10 can provide this large of a tilting angle because it does not include a counterbalancing mechanism. As shown in FIGS. 13 a-d, some embodiments of the stand 10 include the display tilt mechanism 210 between the interface 30 and the first portion 34 to allow the display 20 to tilt. In such embodiments the brake mechanism 40 does not tilt along with the display 20. In other embodiments, such as shown in FIGS. 14 a-d, the tilt mechanism is provided along the second portion 36 such that the brake mechanism 40 and first portion 34 tilt along with the display 20. In yet other embodiments, as shown in FIGS. 15 a-16 d, the tilt mechanism is provided between the second portion 36 and a base 220 such that the second portion 36, brake mechanism 40, and first portion 34 tilt along with the display 20.

Some embodiments of the stand 10 also allow the display 20 to swivel (e.g., pan). In some embodiments, the stand 10 includes a base 220 with a horizontal surface adapted to rest on a generally horizontal support surface, and the base further includes wheels 230 to facilitate swivel movement of the display 20 and the stand 10, as shown in FIG. 18 j. In other embodiments, as shown in FIG. 18 k, the stand 10 includes a base 220 with a horizontal surface adapted to rest on a generally horizontal support surface, and the base includes a first base portion 240 adapted to resist relative movement between itself and the generally horizontal support surface and a second base portion 250 rotatable with respect to the first base portion and coupled to the second portion 36 to facilitate swivel movement of the display 20. In yet other embodiments, as shown in FIG. 18 l, the stand 10 includes a base with a horizontal surface adapted to rest on a generally horizontal support surface, and the second portion 36 is rotatably coupled to the base such that the second portion 36 is rotatable with respect to the base to facilitate swivel movement of the display 20. In yet other embodiments, as shown in FIG. 18 m, the first portion 34 is rotatably coupled to the second portion 36 such that the first portion 34 is rotatable with respect to the second portion 36 to facilitate swivel movement of the display 20.

Embodiments of the invention also include any of the stands described herein with an electronic display 20 attached to the stands. In some embodiments, the interface 30 attaches to the display 20 at approximately the center of the display 20.

In other embodiments, the interface 30 attaches to the display 20 at approximately the bottom of the display 20.

The stands can be supported in any manner that allows a user to view a display 20 attached to the stand 10 and adjust the vertical position of the display 20. As described above, some embodiments of the stand 10 include a base 220 coupled to the second portion 36, the base having a flat horizontal surface adapted to sit atop a horizontal work surface such as a desk. In other embodiments, as shown in FIG. 19 a, the stand 10 includes a wall mount coupled to the fixed second portion 36, the wall mount having a vertical surface adapted to attach the mount to a vertical surface. In some embodiments, as shown in FIG. 19 b, the second portion 36 is attached to a cart 250 having a vertical riser 260, a base 270, and a keyboard tray 280. In yet other embodiments, as shown in FIGS. 19 c-f, the second portion 36 is attached to an articulating arm. As shown, such embodiments may also include a keyboard arm and tray, and the articulating arm can include a four-bar arm.

Embodiments of the invention also include methods of using any of the stands described herein. In some embodiments, the method includes adjusting the height of an electronic display 20 supported by a stand by one or more of the following steps. In some embodiments, the method includes grasping an electronic display 20 (e.g., an electronic display weighing between about 0.25 and about 3 kilograms) supported by the stand. Further the method can include selectively locking and unlocking a brake mechanism 40 with the same hand that grasps the electronic display 20, wherein when the brake is locked the relative vertical position of the display 20 is fixed. The method may also include applying external force, such as by a user's hand) to adjust the vertical position of the display 20 when the brake is unlocked such that counterbalancing forces to counterbalance a weight of the display 20 are not provided by the stand.

In some embodiments, the brake mechanism 40 is selectively locked and unlocked by grasping an actuator 50 proximate an outer edge 60 of the electronic display 20. In other embodiments, the brake mechanism 40 is selectively locked and unlocked by tilting the electronic display 20.

Thus, embodiments of the invention are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention and the scope of the appended claims.

What is claimed is:

1. A stand for an electronic display, comprising:
   an interface to attach the display to the stand, the interface attached to a first portion adapted to move vertically along with the display relative to a fixed second portion as a vertical position of the display is adjusted, wherein the second portion includes a vertical pole and the first portion connects the interface to the pole; and
   a brake mechanism to selectively fix the position of the first portion relative to the second portion at a desired vertical position, the brake mechanism being selectively lockable and unlockable, wherein when the brake mechanism is locked the relative vertical position between the first and second portions is maintained, wherein the brake mechanism includes at least one torsion spring wrapped around the pole, the torsion spring having an inner diameter smaller than an outer diameter of the pole when the spring is in its relaxed state to provide sufficient frictional forces to maintain the relative vertical position of the first and second portions when the spring is in its relaxed state;
   an actuator to selectively lock and unlock the brake mechanism, the actuator being proximate an outer edge of an electronic display when an electronic display is supported by the stand such that a user may actuate the actuator while grasping the display with the same hand that is grasping the display;
   and further wherein when the brake mechanism is unlocked the relative vertical position between the first and second portions is solely adjustable by application of an external force such that counterbalancing forces to counterbalance a weight of the display or first portion are not provided by the stand.

2. The stand of claim 1, wherein the brake mechanism includes a fixed collar to hold a first leg of the torsion spring in a fixed position relative to the first portion, and a selectively rotatable collar to hold a second leg of the torsion spring in a selectively rotatable position with respect to the first portion, the fixed and rotatable collars being received around the pole, such that when the actuator is actuated the rotatable collar is rotated with respect to the first portion to partially unwind the torsion spring from its relaxed state, the partial unwinding increasing the inner diameter of the spring to reduce the frictional forces between the spring and the pole, thereby allowing the first portion to move relative to the pole such that the vertical position of the display can be adjusted at an infinite number of vertical positions along the pole.

3. The stand of claim 1, wherein the second portion is a generally vertical elongated member and the first portion travels in a generally straight path as it travels along the second portion.

4. The stand of claim 1, wherein the second portion is curved and the first portion travels in a generally curved path as it travels along the second portion.

5. The stand of claim 3, further including a tilt mechanism between the interface and the first portion.

6. The stand of claim 1, wherein a tilt mechanism is provided to allow the display to tilt.

7. The stand of claim 6, wherein the tilt mechanism allows for tilting angles of about 40 degrees.

8. The stand of claim 6, wherein the tilt mechanism is provided between the interface and the first portion such that the brake mechanism does not tilt along with the display.

9. The stand of claim 6, wherein the tilt mechanism is provided along the second portion such that the brake mechanism and first portion tilt along with the display.

10. The stand of claim 6, wherein the tilt mechanism is provided between the second portion and a base such that the second portion, brake mechanism, and first portion tilt along with the display.

11. The stand of claim 1, further wherein the display is swivelable.

12. The stand of claim 11, wherein the stand includes a base with a horizontal surface adapted to rest on a generally horizontal support surface, the base further including wheels in the base to facilitate swivel movement of the display.

13. The stand of claim 11, wherein the stand includes a base with a horizontal surface adapted to rest on a generally horizontal support surface, the base further including a first base portion adapted to resist relative movement between itself and the generally horizontal support surface and a second base portion rotatable with respect to the first base portion and coupled to the second portion to facilitate swivel movement of the display.

14. The stand of claim 11, wherein the stand includes a base with a horizontal surface adapted to rest on a generally horizontal support surface, the second portion rotatably coupled to the base such that the second portion is rotatable with respect to the base to facilitate swivel movement of the display.

15. The stand of claim 11, wherein the first portion is rotatably coupled to the second portion such that the first portion is rotatable with respect to the second portion to facilitate swivel movement of the display.

16. The stand of claim 1, further including the electronic display, wherein the interface attaches to the display at approximately the center of the display.

17. The stand of claim 1, further including the electronic display, wherein the interface attaches to the display at approximately the bottom of the display.

18. The stand of claim 1, further including a base coupled to the second portion, the base having a flat horizontal surface adapted to sit atop a horizontal work surface.

19. The stand of claim 1, further including a wall mount coupled to the fixed second portion, the wall mount having a vertical surface adapted to attach the mount to a vertical surface.

20. The stand of claim 1, wherein the second portion is attached to a cart having a vertical riser, a base, and a keyboard tray.

21. The stand of claim 1, wherein the second portion is attached to an articulating arm.

22. The stand of claim 21, further including a keyboard arm and tray.

23. The stand of claim 21, wherein the articulating arm includes a four-bar arm.

24. The stand of claim 1, wherein the brake mechanism includes an actuator pivot mechanism, and actuation of the actuator causes the actuator to pivot about the actuator pivot mechanism to unlock brake mechanism.

* * * * *